United States Patent
Lee et al.

(10) Patent No.: US 10,964,382 B2
(45) Date of Patent: Mar. 30, 2021

(54) VARIABLE RESISTIVE MEMORY DEVICE AND METHOD OF DRIVING A VARIABLE RESISTIVE MEMORY DEVICE

(71) Applicant: SK hynix Inc., Icheon-si (KR)

(72) Inventors: Ki Won Lee, Cheongju-si (KR); Seok Man Hong, Seoul (KR); Tae Hoon Kim, Seongnam-si (KR); Hyung Dong Lee, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/296,796

(22) Filed: Mar. 8, 2019

(65) Prior Publication Data
US 2020/0027505 A1    Jan. 23, 2020

(30) Foreign Application Priority Data
Jul. 19, 2018   (KR) .................. 10-2018-0083866

(51) Int. Cl.
*G11C 13/00* (2006.01)
(52) U.S. Cl.
CPC ........ *G11C 13/0038* (2013.01); *G11C 13/003* (2013.01); *G11C 13/0026* (2013.01); *G11C 13/0028* (2013.01); *G11C 13/0033* (2013.01); *G11C 13/0061* (2013.01); *G11C 13/0069* (2013.01); *G11C 13/0004* (2013.01); *G11C 2213/31* (2013.01); *G11C 2213/32* (2013.01)

(58) Field of Classification Search
CPC .................................................. G11C 13/0061
USPC ......................................................... 365/148
See application file for complete search history.

(56) References Cited

U.S. PATENT DOCUMENTS

| 9,418,761 B2 | 8/2016 | Arslan et al. | |
| 2012/0014164 A1* | 1/2012 | Kamoshida | G11C 13/0061 365/148 |

FOREIGN PATENT DOCUMENTS

| KR | 1020100022784 A | 3/2010 |
| KR | 1020140075365 A | 6/2014 |
| KR | 1020160016386 A | 2/2016 |

* cited by examiner

*Primary Examiner* — Jason Lappas
(74) *Attorney, Agent, or Firm* — William Park & Associates Ltd.

(57) ABSTRACT

A variable resistive memory device includes a memory cell, a first circuit, and a second circuit. The memory cell is connected between a word line and a bit line. The first circuit provides the bit line with a first pulse voltage based on at least one enable signal. The second circuit provides the word line with a second pulse voltage based on the enable signal. The first circuit generates the first pulse voltage increased in steps from an initial voltage level to a target voltage level.

18 Claims, 18 Drawing Sheets

VARIABLE RESISTIVE MEMORY DEVICE AND METHOD OF DRIVING A VARIABLE RESISTIVE MEMORY DEVICE

CROSS-REFERENCES TO RELATED APPLICATION

The present application claims priority under 35 U.S.C. § 119(a) to Korean application number 10-2018-0083866, filed on Jul. 19, 2018, in the Korean Intellectual Property Office, which is incorporated herein by reference in its entirety.

BACKGROUND

1. Technical Field

Various embodiments may generally relate to a semiconductor memory device and a method of driving the semiconductor memory device. More particularly, embodiments may generally relate to a variable resistive memory device for performing memory operations by resistance changes, and a method of driving the variable resistive memory device.

2. Related Art

A phase changeable memory device as a variable resistive memory device may use a phase changeable material as a switching element as well as data storage medium. The data storage medium and the switching element including the phase changeable material may be arranged at points of intersection between word lines and bit lines. This memory type having the above-mentioned structure may be referred to as a cross point array type.

In the cross point array type variable resistive memory device, a transient current may be temporarily applied to a memory cell when the memory cell is turned-on. Various electrical problems caused by these transient currents are currently being studied.

SUMMARY

In example embodiments of the present disclosure, a variable resistive memory device may include a memory cell, a first circuit, and a second circuit. The memory cell may be connected to between a word line and a bit line. The first circuit may provide the bit line with a first pulse voltage based on at least one enable signal. The second circuit may provide the word line with a second pulse voltage based on the enable signal. The first circuit may generate the first pulse voltage increased in steps from an initial voltage level to a target voltage level.

In example embodiments of the present disclosure, a variable resistive memory device may include a memory cell array and a control block. The memory cell array may include a plurality of memory cells. Each of the memory cells may include a plurality of word lines, a plurality of bit lines, and resistance layers connected between the word lines and the bit lines. The control block may select any one of the memory cells in the memory cell array. The control block may apply a voltage between a bit line and a word line connected with the selected memory cell to form a minimum voltage difference for turning-on the selected memory cell between the bit line and the word line connected with the selected memory cell. The control block may stepwise increase the voltage applied to the bit line to a target voltage level when the selected memory cell is turned on.

In example embodiments of the present disclosure, a method of driving a variable resistive memory device may include writing to the variable resistive memory device, which includes a memory cell. The memory cells may include a plurality of word lines, a plurality of bit lines, and resistance layers connected between the word lines and the bit lines. In writing to the variable resistive memory device, a first word line selection voltage and an initial voltage may be applied to the word line and the bit line, respectively, in response to a write enable signal to provide a voltage difference between the word line and the bit line with a minimum voltage difference for turning on the memory cell. The turning on of the memory cell may then be detected. A write voltage may be applied to the bit line based on the turning-on detection result. The write voltage increased stepwise from the initial voltage to a target write voltage level may be supplied to the bit line in response to the turning-on detection result.

BRIEF DESCRIPTION OF THE DRAWINGS

The above and other aspects, features, and advantages of the subject matter of the present disclosure are more clearly understood from the following detailed description taken in conjunction with the accompanying drawings, in which.

DETAILED DESCRIPTION

Various embodiments of the present disclosure are described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments. However, presented embodiments should not be construed as limiting the present teachings. Although a limited number of possible embodiments are shown and described, it will be appreciated by those of ordinary skill in the art that changes may be made to these embodiments without departing from the principles and spirit of the present teachings.

Figure 1:
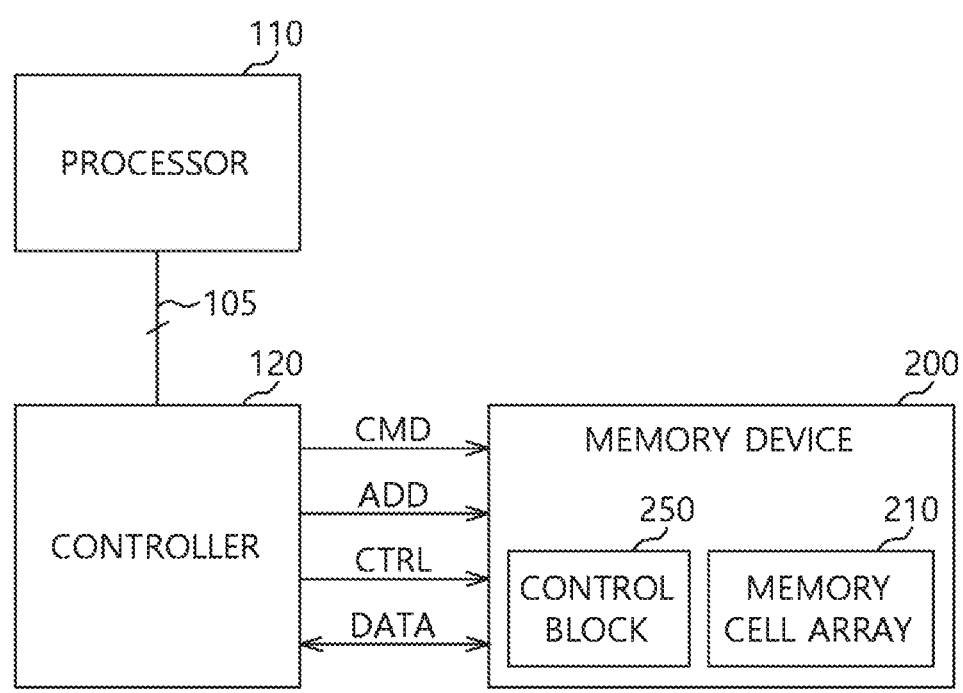
FIG. 1 shows a block diagram illustrating a semiconductor system, in accordance with example embodiments.

FIG. 1 shows a block diagram illustrating a semiconductor system 100, in accordance with example embodiments.

Referring to FIG. 1, the semiconductor system 100 may include a processor 110, a controller 120, and a semiconductor memory device 200.

The processor 110 may be connected with the controller 120 through a bus 105. The processor 110 may provide the controller 120 with memory access requests including memory addresses and data such as a read request, a write request, etc. The processor 110 may receive read data from the controller 120.

The controller 120 may provide the semiconductor memory device 200 with commands CMD, such as a read command, a write command, etc., for memory operations of the semiconductor memory device 200, an address ADD, data DATA, and a control signal CTRL. The controller 120 may store data in the semiconductor memory device 200 or read data in the semiconductor memory device in response to the read command and the write command.

The semiconductor memory device 200 may include a variable resistive memory device including a variable resistive element. The variable resistive element may include a single layer or a multi-layer having variable resistive characteristics. For example, the variable resistive element may include a material used in an RRAM, a PRAM, an MRAM, an FRAM, etc., such as a chalcogenide compound, a transition metal compound, a ferroelectrics, ferromagnetic substances, etc. However, the variable resistive element may include other materials as well as the above-mentioned materials. Particularly, the variable resistive element may include metal oxide. The metal oxide may include transition metal oxide, such as nickel oxide, titanium oxide, hafnium oxide, zirconium oxide, tungsten oxide, cobalt oxide, etc., a perovskite material, such as STO(SrTiO), PCMO(Pr-CaMnO), etc. The variable resistive element may have switching characteristics under different resistances by generations/extinctions of current filament by vacancy conducts.

The variable resistive element may include a phase changeable material. The phase changeable material may include a chalcogenide material such as GST(Ge—Sb—Te). The variable resistive element may have switching characteristics under different resistances by being stabilized into any one of a crystalline state and an amorphous state by heat.

The variable resistive element may include two magnetic layers and a tunnel barrier layer between the magnetic layers. The magnetic layers may include NiFeCo, CoFe, etc. The tunnel barrier layer may include $Al_2O_3$. The variable resistive element may represent a switching characteristic between different resistances in accordance with a magnetization direction of the magnetic layers. For example, when the two magnetic layers may have parallel magnetization directions, the variable resistive element may have a low resistance. In contrast, when the two magnetic layers have opposite magnetization directions, the variable resistive element may have a high resistance.

Hereinafter, the semiconductor memory device may include the variable resistive memory device 200. The variable resistive memory device 200 may include a memory cell array 210 and a control block 250.

Figure 2:
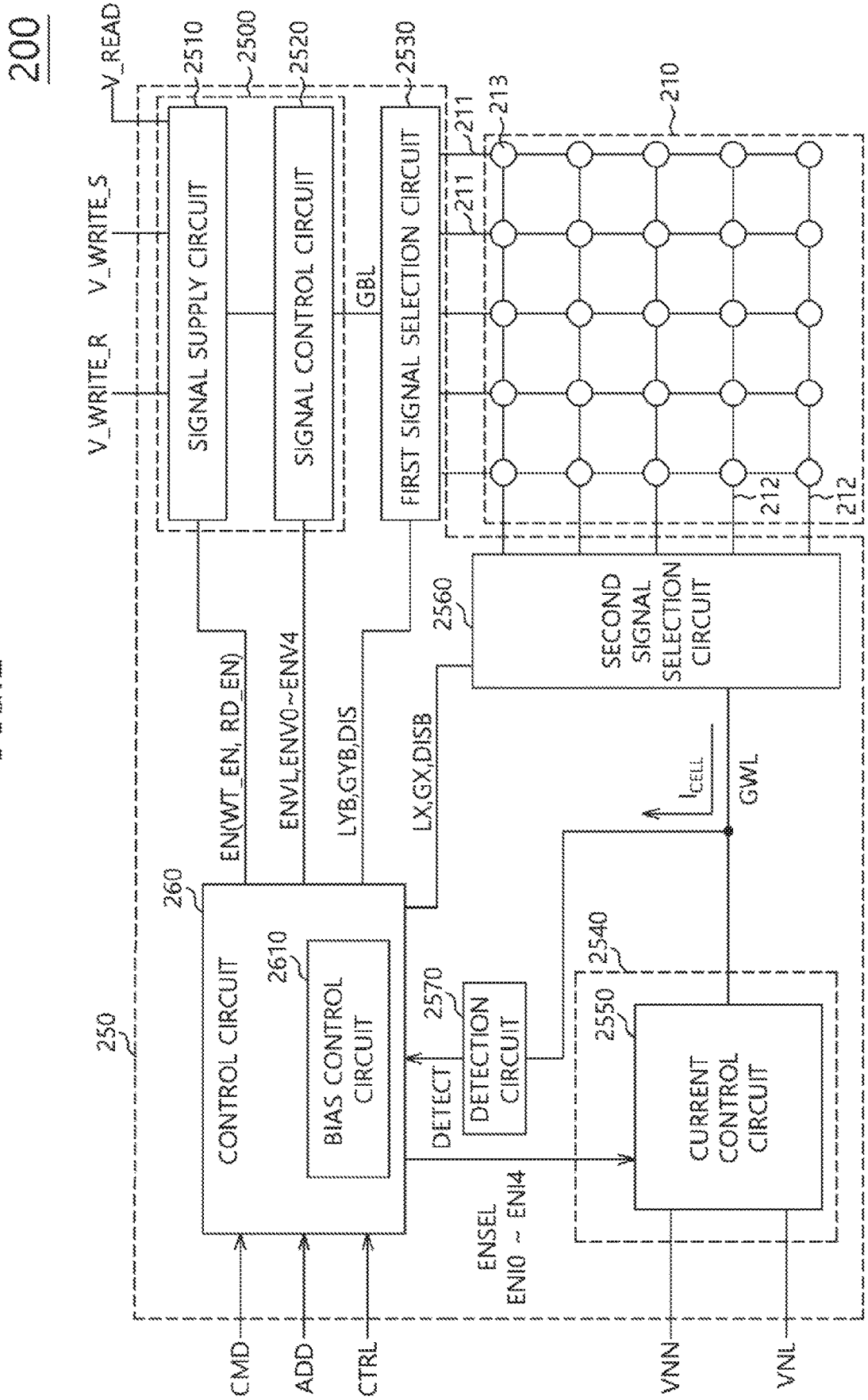
FIG. 2 shows a block diagram illustrating a variable resistive memory device of the semiconductor system in FIG. 1.

FIG. 2 shows a block diagram illustrating a variable resistive memory device of the semiconductor system in FIG. 1.

Referring to FIG. 2, the variable resistive memory device 200 may include a memory cell array 210 and a control block 250.

The memory cell array 210 may include a plurality of first signal lines 211, a plurality of second signal lines 212, and a plurality of memory cells 213 connected between the first signal lines 211 and the second signal lines 212. The first signal lines 211 may include bit lines extended parallel to each other. The second signal lines 212 may include word lines extended parallel to each other. The second signal lines 212 may be positioned on a plane different from a plane on which the first signal lines 211 may be positioned. The second signal lines 212 may be intersected and overlapped with the first signal lines 211. The memory cells 213 may be positioned at overlapped points between the first signal lines 211 and the second signal lines 212. Thus, the memory cell array 210 may correspond to a cross point array. In example embodiments, the memory cell array 210 may include the five bit lines and the five word lines shown. However, the numbers of the word lines and the bit lines may be changed in accordance with an integration degree of the semiconductor memory device. Further, hereinafter, the first signal lines 211 may be referred to as the bit lines and the second signal lines 212 may be referred to as the word lines. Alternatively, the first signal lines 211 may correspond to the word lines and the second signal lines 212 may correspond to the bit lines.

Figure 3:
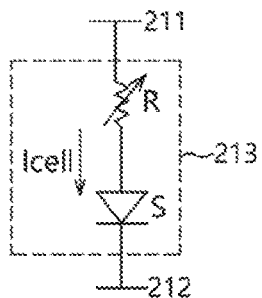
FIG. 3 shows a circuit diagram illustrating a memory cell structure, in accordance with example embodiments.

FIG. 3 shows a circuit diagram illustrating a memory cell structure in accordance with example embodiments.

Referring to FIG. 3, the memory cell 213 may include a variable resistance R connected between the bit line 211 and the word line 212, and a selection element S. The variable resistance R may be changed by an electrical pulse applied to the bit line 211, i.e., a current amount generated by a voltage. For example, the variable resistance R may include a phase changeable layer or a resistance changeable layer having a crystalline state changed by the current amount. The phase changeable layer may include GaSb, InSb, InSe, $Sb_2Te_3$, GeTe, GeSbTe, GaSeTe, InSbTe, $SnSb_2Te_4$, InSbGe, AgInSbTe, (GeSn)SbTe, GeSb(SeTe), $Te_{81}Ge_{15}Sb_2S_2$, etc.

The phase changeable layer may have an amorphous state having a high resistance and a crystalline state having a low resistance. The phase changeable layer may have phases changed by Joule's heat generated the current amount and a cooling time.

Each of the memory cells 213 may include a single-level cell for storing 1 bit of data. In this case, the memory cell 213 may have two resistance distributions in accordance with stored data. Alternatively, the memory cells 213 may include a multi-level cell for storing 2 or more bits of data. In this case, the memory cell 213 may have four or eight resistance distributions in accordance with stored data.

The selection element S may include a switch, such as a diode. Alternatively, the selection element S may include a transistor or an Ovonics threshold switch including a phase changeable material.

Referring again to FIG. 2, the control block 250 may include a first read/write circuit 2500, a first signal selection circuit 2530, a second read/write circuit 2540, a second signal selection circuit 2560, a detection circuit 2570, and a control circuit 260.

The first read/write circuit 2500 may generate a step-shaped voltage gradually increased for a predetermined time to suppress a temporary inflow of a transient current through the bit line when the memory cell is turned-on. The first read/write circuit 2500 may include a signal supply circuit 2510 and a signal control circuit 2520.

The signal supply circuit 2510 may select any one of a plurality of voltages based on an operation mode signal EN. The signal supply circuit 2510 may provide the signal control circuit 2520 with the selected voltage. For example, the signal supply circuit 2510 may receive a reset voltage V_WRITE_R, a set voltage V_WRITE_S, and a read voltage V_READ from an exterior source. When a write enable signal WT_EN is enabled as the operation mode signal EN, the signal supply circuit 2510 may select and output the reset voltage V_WRITE_A or the set voltage V_WRITE_S. When a read enable signal RD_EN is enabled as the operation mode signal EN, the signal supply circuit 2510 may select the read voltage V_READ. The signal supply circuit 2510 may include a multiplexer for selecting the voltages.

Figure 4:
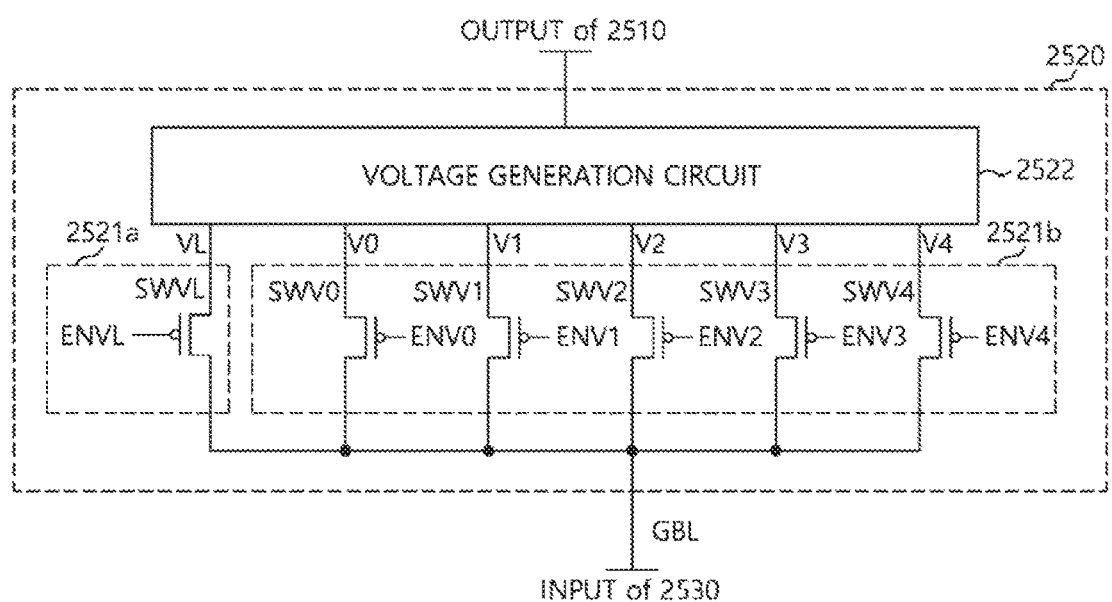
FIG. 4 shows a circuit diagram illustrating a signal control circuit, in accordance with example embodiments.

FIG. 4 shows a circuit diagram illustrating the signal control circuit 2520 of FIG. 2, in accordance with example embodiments.

Referring to FIGS. 2 and 4, the signal control circuit 2520 may be connected between an output terminal of the signal supply circuit 2510 and a global bit line GBL. The global bit line GBL may be connected to an input terminal of the first signal selection circuit 2530. The signal control circuit 2520 may control the voltage supplied from the signal supply circuit 2510 to provide the voltage with an increased step shape.

The signal control circuit 2520 may include an initial voltage supply circuit 2521a and a step voltage supply circuit 2521b.

The initial voltage supply circuit 2521a may include an initial voltage switch SWVL. The initial voltage switch SWVL may transmit an initial voltage VL to the first signal selection circuit 2530 in response to an initial voltage control signal ENVL. For example, when the write enable signal WT_EN is enabled and the detection signal DETECT is disabled, the initial voltage control signal ENVL may be enabled to a low level. For example, the initial voltage switch SWVL may include a PMOS transistor.

Thus, in order to maintain the turn-on of the memory cell 213 at an initial selection timing of the memory cell 213, the initial voltage supply circuit 2521a may provide the global bit line GBL with the initial voltage VL. The generation of the initial voltage control signal ENVL is illustrated later.

The step voltage supply circuit 2521b may include a plurality of voltage switches SWV0~SWV4 driven in response to a plurality of voltage control signals ENV0~ENV4. As used herein, the tilde "~" indicates a range of components. For example, "SWV0~SWV4" indicates the switches SWV0, SWV1, SWV2, SWV3, and SWV4 shown in FIG. 4. In example embodiments, the voltage switches SWV0~SWV4 may include PMOS transistors. The voltage control signals ENV0~ENV4 may be sequentially enabled in response to the detection signal DETECT. Thus, the step voltage supply circuit 2521b may sequentially output gradually increased first to fifth voltages V0~V4. In example embodiments, the step voltage supply circuit 2521b may selectively output any one of the five different voltages. Alternatively, the step voltage supply circuit 2521b may output at least two voltages. Further, the number of voltage switches in the step voltage supply circuit 2521b may be changed. The fifth voltage V4 as a maximum voltage outputted from the step voltage supply circuit 2521b may be the reset voltage V_WRITE_R having the highest level among the set write voltages. The first voltage V0 may be higher than the initial voltage VL.

In example embodiments, the initial voltage VL and the gradually increased first to fifth voltages V0~V4 may be autonomously generated by a voltage generation circuit 2522 in the signal control circuit 2520.

In FIG. 4, the voltage generation circuit 2522 may be included in the signal control circuit 2520. Alternatively, the voltage generation circuit 2522 may be included in the control circuit 260 or the signal supply circuit 2510. Further, the initial voltage VL and the first to fifth voltages V0~V4 may be supplied to the initial voltage supply circuit 2521a and the step voltage supply circuit 2521b through a power supply without the voltage generation circuit 2522.

Figure 5:
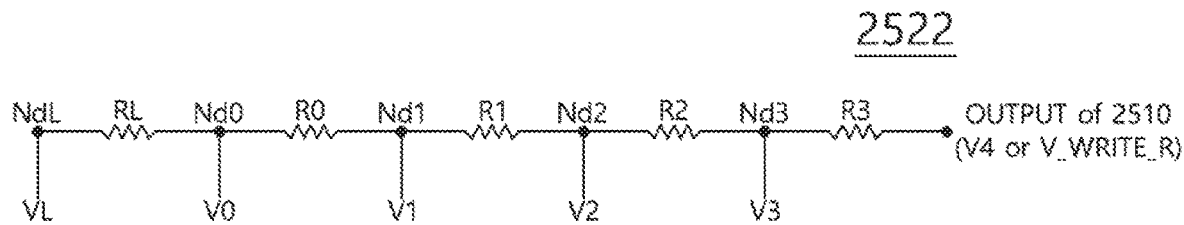
FIG. 5 shows a circuit diagram illustrating a voltage generation circuit in FIG. 4.

FIG. 5 shows a circuit diagram illustrating the voltage generation circuit 2522 of FIG. 4.

Referring to FIG. 5, the voltage generation circuit 2522 may include a plurality of resistances RL, R0, R1, R2, and R3 connected to the output terminal of the signal supply circuit 2510. The resistances RL~R3 may be serially connected with each other. Different levels of voltages VL, V0, V1, V2, and V3 may be generated at connection nodes NdL~Nd3 in accordance with voltage drops of the resistances RL~R3. That is, an output voltage of the signal supply circuit 2510, for example, the fifth voltage V4 may pass through the fourth resistance R3, the third resistance R2, the second resistance R1, and the first resistance R0 to sequentially generate the voltage drops, thereby generating the fourth voltage V3, the third voltage V2, the second voltage V1, the first voltage V0, and the initial voltage VL. Here, the fourth voltage V3 may be higher than the third voltage V2, the third voltage V2 may be higher than the second voltage V1, the second voltage V1 may be higher than the first voltage V0, and the first voltage may be higher than the initial voltage VL.

The initial voltage switch SWVL of the initial voltage supply circuit 2521a and the first to fifth voltage switches SWV0~SWV4 of the step voltage supply circuit 2521b may be sequentially turned-on in response to the initial voltage control signal ENVL and the sequentially enabled voltage control signals ENV0~ENV4. Thus, when the write enable signal WT_EN is enabled, the initial voltage VL to the fifth voltage V4 may be sequentially supplied to the global bit line GBL. Here, the voltage control signals ENV0~ENV4 may be generated from a control signal generation circuit 2621b of the control circuit 260, illustrated later.

Figure 6:
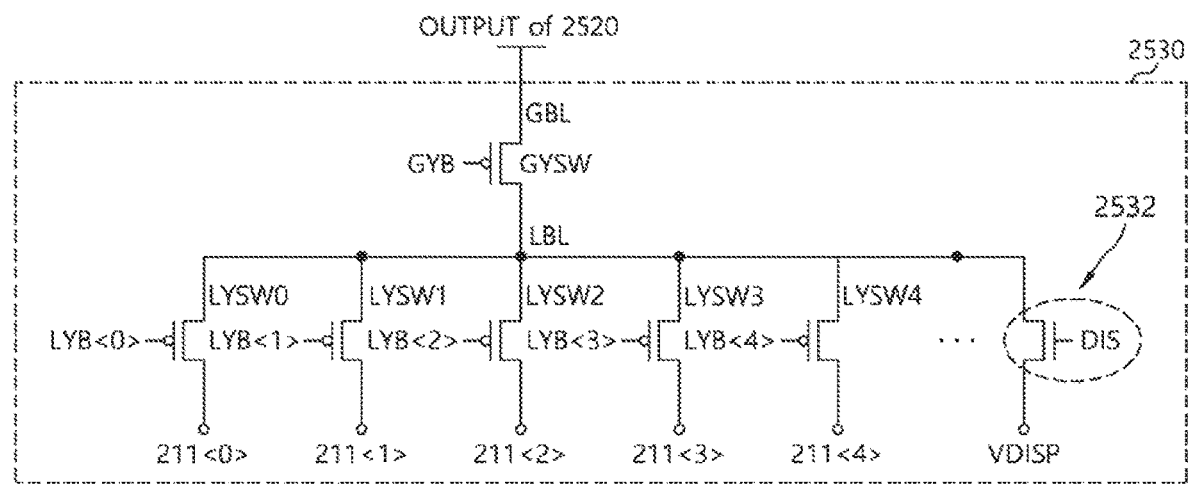
FIG. 6 shows a circuit diagram illustrating a first signal selection circuit, in accordance with example embodiments.

FIG. 6 shows a circuit diagram illustrating the first signal selection circuit 2530 of FIG. 2, in accordance with example embodiments.

Referring to FIGS. 2 and 6, the first signal selection circuit 2530 may be connected between the global bit line GBL corresponding to the output terminal of the signal control circuit 2520 and the bit lines 211<0>~211<4>. For example, the first signal selection circuit 2530 may include a global bit line switch GYSW and first to fifth local bit line switches LYSW0~LYSW4.

The global bit line switch GYSW may be driven in response to a global bit line selection signal GYB. The output signal of the signal control circuit 2520 may be transmitted to a local bit line LBL by driving of the global bit line switch GYSW.

For example, the first to fifth local bit line switches LYSW0~LYSW4 may be connected with the global bit line switch GYSW in common. The first to fifth local bit line switches LYSW0~LYSW4 may be selectively driven in response to local bit line selection signals LYB<0>~LYB<4>. Thus, a signal of the local bit line LBL may be transmitted to a selected bit line 211 through any one of the local bit line switches LYSW0~LYSW4. In FIG. 6, the first signal selection circuit 2530 may include the five local bit line switches LYSW0~LYSW4 connected to one global bit line switch GYSW. Alternatively, different numbers of local bit line switches may be included in different embodiments. Further, the first signal selection circuit 2530 may include a plurality of the global bit line switches GYSW connected to the local bit line switches LYSW0~LYSW4, respectively. Here, the control circuit 260 may generate the global bit line selection signal GYB and the local bit line selection signals LYB<0>~LYB<4> based on a column address Y-ADD.

The first signal selection circuit 2530 may further include a discharge circuit 2532 for discharging the signal of the local bit line LBL. The discharge circuit 2532 may be driven in response to a discharge enable signal DIS provided from the control circuit 260 to discharge the signal of the local bit line LBL into a positive discharge voltage VDISP. For example, the discharge circuit 2532 may include an NMOS transistor.

The second read/write circuit 2540 may sequentially supply a current to the memory cell when the memory cell is turned-on. For example, the second read/write circuit 2540 may include a current control circuit 2550 as shown in FIG. 2.

Figure 7:
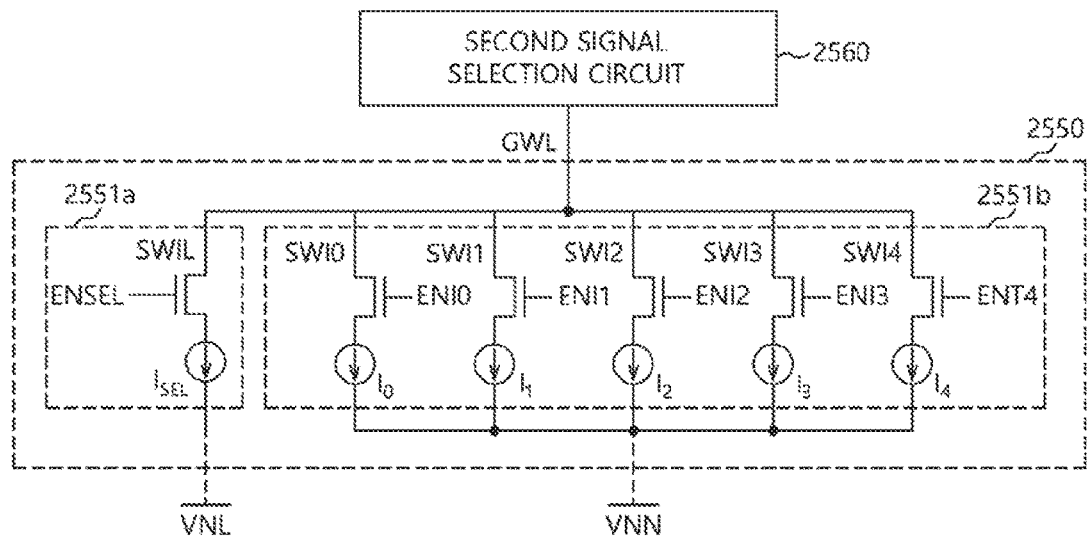
FIG. 7 shows a circuit diagram illustrating a current control circuit, in accordance with example embodiments.

FIG. 7 shows a circuit diagram illustrating the current control circuit 2550 of FIG. 2, in accordance with example embodiments.

Referring to FIGS. 2 and 7, the current control circuit 2550 may gradually increase an inputted write current to a target current when the memory cell is turned-on. The current control circuit 2550 may be connected between first and second word line selection voltage terminals VNL and VNN and a global word line GWL. The current control circuit 2550 may include an initial current supply circuit 2551a and a step current supply circuit 2551b.

The initial current supply circuit 2551a may include an initial current switch SWIL driven in response to an initial current control signal ENSEL and an initial current source ISEL. For example, the initial current switch SWIL may include an NMOS transistor. The initial current control signal ENSEL may be generated after the write enable signal WT_EN is enabled and before the detection signal DETECT is enabled (that is, the detection signal may be disabled), similarly to the initial voltage control signal ENVL. The initial current source ISEL may be connected between the initial current switch SWIL and the first word line selection voltage terminal VNL. Thus, the initial current supply circuit 2551a may apply an initial current having a minimum level for maintaining the turn-on of the memory cell 213 to the selected memory cell 213. For example, the initial current control signal ENSEL may have an invert level of the initial voltage control signal ENVL.

The step current supply circuit 2551b may include a plurality of current switches SWI0~SWI4 driven in response to the current control signals ENI0~ENI4, and a plurality of current sources I0~I4 connected to the current switches SWI0~SWI4, respectively. The current control signals ENI0~ENI4 may be generated based on the write enable signal WT_EN and the detection signal DETECT. The current control signals ENI0~ENI4 may be sequentially enabled corresponding to the voltage control signals ENV0~ENV4. For example, the current control signals ENI0~ENI4 may have invert levels of the voltage control signals ENV0~ENV4. For example, the current switches SWI0~SWI4 may include NMOS transistors. A drain of the NMOS transistor may be connected with the global word line GBL. The global word line GWL may be connected with the second signal selection circuit 2560. The current sources I0~I4 may selectively provide currents in accordance with drives of the current switches SWI0~SWI4. The first to fifth current sources I0~I4 may provide sequentially increased currents.

Figure 8:
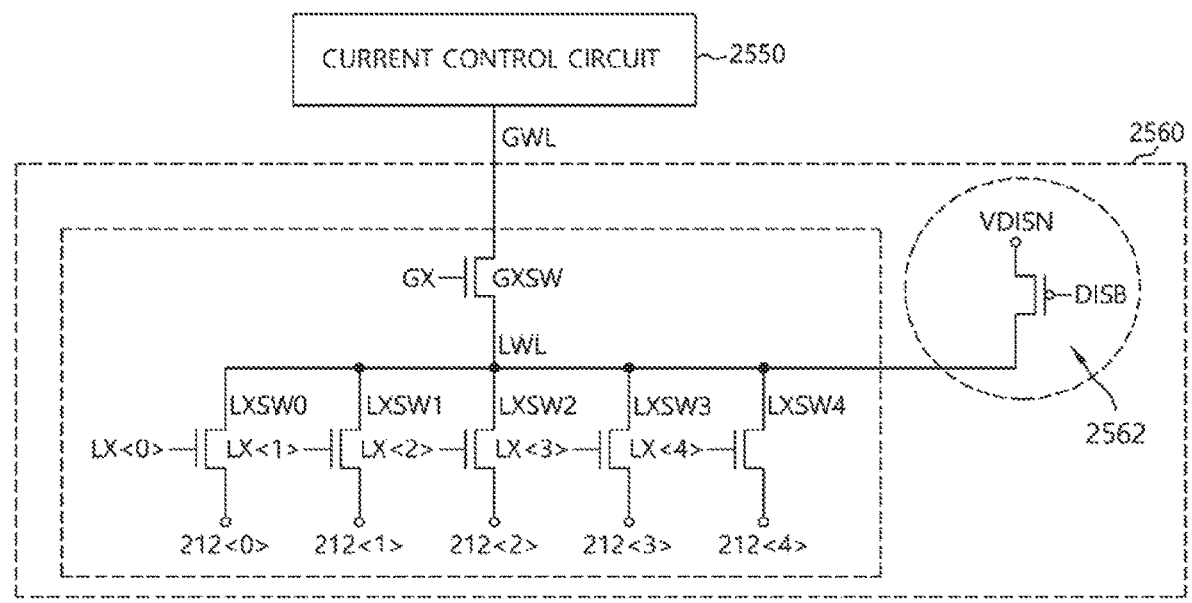
FIG. 8 shows a circuit diagram illustrating a second signal selection circuit, in accordance with example embodiments.

FIG. 8 shows a circuit diagram illustrating the second signal selection circuit 2560 of FIG. 2, in accordance with example embodiments.

Referring to FIGS. 2 and 8, the second signal selection circuit 2560 may select any one of the word lines 212<0>~212<4>. The second signal selection circuit 2560 may be connected between the global word line GWL connected with the current control circuit 2550 and the word lines 212<0>~212<4> of the memory cell array 210. The second signal selection circuit 2560 may include a global word line switch GXSW and first to fifth local word line switches LXSW0~LXSW4.

The global word line switch GXSW may be connected with the initial switch SWIL and the switches SWI0~SWI4 of the current control circuit 2550 in common. The global word line switch GXSW may transmit an output signal of the signal control circuit 2550 to a local word line LWL in response to a global word line selection signal GX.

The first to fifth local word line switches LXSW0~LXSW4 may be selectively driven in response to local word line selection signals LX<0>~LX<4>. A voltage (or a current) provided from the current control circuit 2550 may be selectively transmitted to the word lines 212<0>~212<4> by the selective driving of the first to fifth local word line switches LXSW0~LXSW4. The second signal selection circuit 2560 may transmit the output voltage of the current control circuit 2250, for example, the first or the second word line selection voltage VNL or VNN to the selected word line 212<0>~212<4>. The second signal selection circuit 2560 may transmit a current Icell of the selected memory cell 213 to the detection circuit 2570 using the corresponding global word line GWL. The control circuit 260 may generate the global word line selection signal GX and the local bit line selection signals LX<0>~LX<4> based on the row address X-ADD.

The second signal selection circuit 2560 may further include a pre-charge circuit 2562 for pre-charging the local word line LWL. The pre-charge circuit 2562 may pre-charge the local word line LWL with a negative pre-charge voltage VDISN in response to an inverted discharge enable signal DISB. For example, the pre-charge circuit 2562 may include a PMOS transistor.

Figure 9:
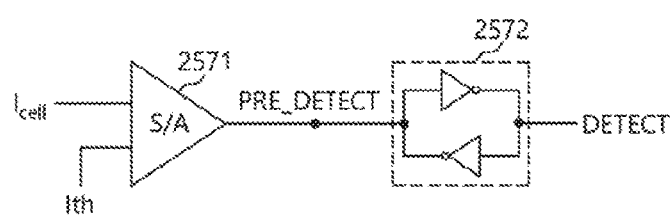
FIG. 9 shows a circuit diagram illustrating a detection circuit, in accordance with example embodiments.

FIG. 9 shows a circuit diagram illustrating the detection circuit of FIG. 2, in accordance with example embodiments.

Referring to FIGS. 2 and 9, the detection circuit 2570 may detect an output current Icell of the selected memory cell 213 to detect a turn-on timing of the memory cell 213.

The detection circuit 2570 may include a sense amplifier 2571 and a latch 2572. The sense amplifier 2571 may receive the output current Icell of the selected memory cell 213. The sense amplifier 2571 may detect a point where the output current Icell of the memory cell 213 is greatly increased. The sense amplifier 2571 may consider the point as the turn-on timing or a snapback timing to output a pre-detection signal PRE_DETECT. For example, the sense amplifier 2571 may receive a threshold current Ith as a reference to current. When the output current Icell of the memory cell 213 is increased to at or above the threshold current Ith, the sense amplifier 2571 may output the pre-detection signal PRE_DETECT.

The latch 2572 may latch the pre-detection signal PRE_DETECT as the output signal of the sense amplifier 2571 to output the detection signal DETECT.

Referring again to FIG. 2, the control circuit 260 may write the data in the memory cell array 210 based on the command CMD, the address ADD, and the control signal CTRL received from the controller 120. The control circuit 260 may generate the operation mode signal EN for reading the data DATA from the memory cell array 210 and the control signals ENVL, ENV0~ENV4, ENSEL and ENI0~ENI4. The operation mode signal EN may include the write enable signal WT_EN and the read enable signal RD_EN for operation of the memory device. Although not depicted in the drawings, the control signal CTRL may include a sensing enable signal, the discharge enable signals DIS and DISB, and the pre-charge enable signal. The control circuit 260 may generate the row address X_ADD and the column address Y_ADD based on the address ADD. The control circuit 260 may generate the column selection signal and the row selection signal using the row address X_ADD and the column address Y_ADD. The column selection signal may include a global bit line selection signal GY and a local bit line selection signal LY (and LYB). The row selection signal may include a global word line selection signal GX and a local word line selection signal LX.

The control circuit 260 may further include a bias control circuit 2610 for generating the initial voltage control signal ENVL, the voltage control signals ENV0~ENV4, the initial current control signal ENSEL and the current control signals ENI0~ENI4 for driving the signal control circuit 2520 and the current control circuit 2550.

Figure 10:
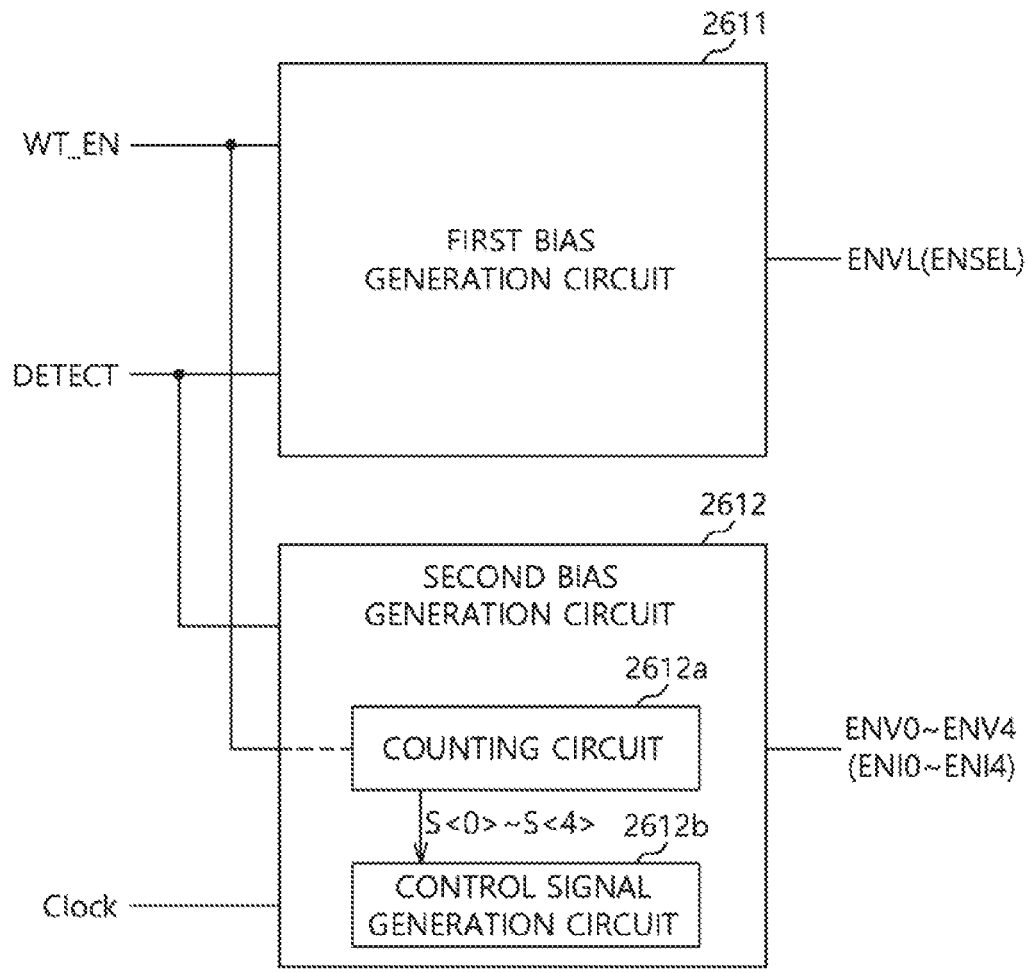
FIG. 10 shows a block diagram illustrating a bias control circuit, in accordance with example embodiments.
Figure 11:
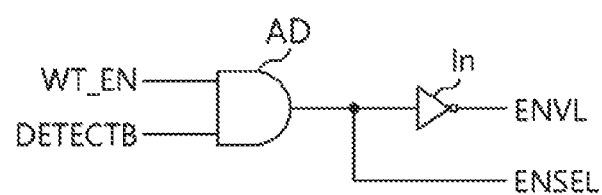
FIG. 11 shows a circuit diagram illustrating a first bias generation circuit, in accordance with example embodiments.
Figure 12:
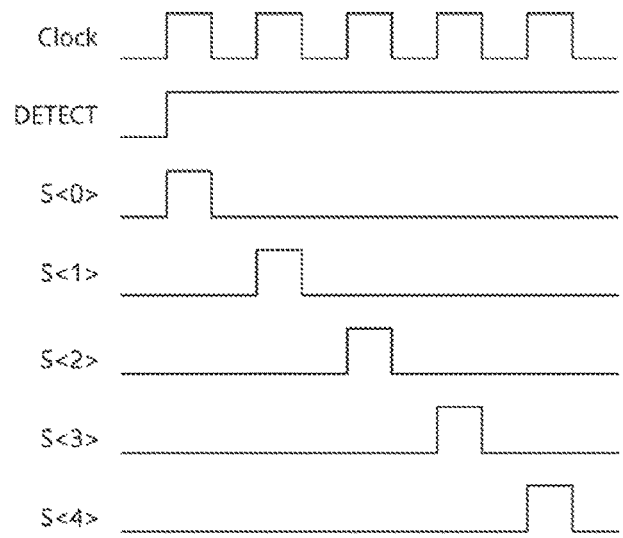
FIG. 12 shows a timing chart illustrating outputs of a counting circuit, in accordance with example embodiments.
Figure 13:
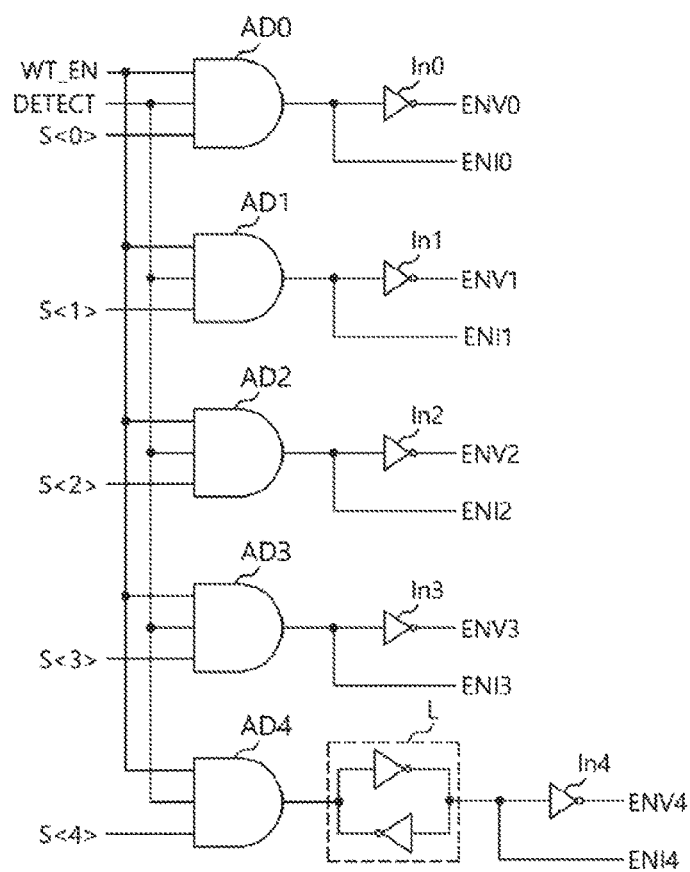
FIG. 13 shows a circuit diagram illustrating a control signal generation circuit, in accordance with example embodiments.

FIG. 10 shows a block diagram illustrating the bias control circuit 2610 of FIG. 2, in accordance with example embodiments. FIG. 11 shows a circuit diagram illustrating a first bias generation circuit 2611 of FIG. 10, in accordance with example embodiments. FIG. 12 shows a timing chart illustrating outputs of a counting circuit 2612a of FIG. 10, in accordance with example embodiments, and FIG. 13 shows a circuit diagram illustrating a control signal generation circuit 2612b of FIG. 10, in accordance with example embodiments.

Referring to FIGS. 2, 4, 7, and 10, the bias control circuit 2610 may include the first bias generation circuit 2611 and a second bias generation circuit 2612. The first bias generation circuit 2611 may receive the write enable signal WT_EN and the detection signal DETECT and output the initial voltage control signal ENVL and the initial current control signal ENSEL. The second bias generation circuit 2612 may receive the write enable signal WT_EN, the detection signal DETECT, and a clock signal Clock and generate the voltage control signals ENV0~ENV4 and the current control signals ENI0~ENI4.

Referring to FIGS. 2, 4, 7, 8, 10, and 11, the first bias generation circuit 2611 may include an AND gate AD and an inverter In. The AND gate AD may perform an AND operation of the write enable signal WT_EN and an inverted detection signal DETECTB to generate the initial current control signal ENSEL. The inverted detection signal is obtained by inverting the detection signal DETECT. When the write enable signal WT_EN is enabled before the memory cell 213 is turned-on, that is, the detection signal DETECT is disabled (the inverted detection signal DETECTB is enabled), the initial current control signal ENSEL may be enabled to a high level. The inverter In may invert the initial current control signal ENSEL to generate the initial voltage control signal ENVL.

Referring to FIGS. 2, 4, 7, 8, and 10, the second bias generation circuit 2612 may include the counting circuit 2612a and the control signal generation circuit 2612b.

As shown in FIGS. 10 and 12, the counting circuit 2612a may generate sequentially enabled first to fifth time control signals S<0>~S<4> based on the write enable signal WT_EN, the detection signal DETECT, and the clock signal Clock. The counting circuit 2612a may include a plurality of flip-flops connected in series. Generally, the first to fifth time control signals S<0>~S<4> are generated by flip flop operations of the plurality of the flip-flops.

Referring to FIGS. 2, 4, 7, 8, 10, to 13, the control signal generation circuit 2612b may include AND gates AD0~AD4 for performing the AND operations of the write enable signal WT_EN, the detection signal DETECT, and the time control signals S<0>~S<4>, and inverters In0~In4 for inverting output signals of the AND gates AD0~AD4.

The first AND gate AD0 may perform the AND operation of the write enable signal WT_EN, the detection signal DETECT, and the first time control signal S<0> to generate the first current control signal ENI0. The first inverter In0 may invert the first current control signal ENI0 to generate the first voltage control signal ENV0.

The second to fourth AND gates AD1 to AD3 may perform AND operations of the write enable signal WT_EN, the detection signal DETECT, and the second to fourth time control signals S<1>~S<3> to generate the second to fourth current control signals ENI1~ENI3, respectively. The second to fourth inverters In1~In3 may invert the second to fourth current control signals ENI1~ENI3 to generate the second to fourth voltage control signals ENV1~ENV3, respectively.

The fifth AND gate AD4 may perform an AND operation of the write enable signal WT_EN, the detection signal DETECT, and the fifth time control signal S<4> and a latch circuit L may latch an output signal of the fifth AND gate AD4 to generate the fifth current control signal ENI4. The fifth inverter In4 may invert the fifth current control signal ENI4 to generate the fifth voltage control signal ENV4.

Generally, when a voltage difference A V between the selected bit line 211 and the selected word line 212 is greater than or equal to a threshold voltage Vth, the memory cell of the cross point memory type variable resistive memory device may be turned-on.

In order to increase the voltage difference A V to be greater than or equal to the threshold voltage Vth when selecting the memory cell 213, driving voltages may be applied, for example, a write voltage may be applied to the bit line 211 and a select voltage may be applied to the word line 212. A snapback and an overshoot may cause the generation of transient current in the selected memory cell 213 when the memory cell 213 is turned-on due to characteristics of the phase changeable memory device.

The snapback may cause an unintended reset state for the selected memory cell. Further, when the selected memory cell is turned-on, a memory cell adjacent to the selected memory cell may be affected by the transient current. Particularly, when a distance between the selected memory cell and the adjacent memory cell is narrow, a resistance level of the adjacent memory cell may be changed due to a coupling occurrence. This write disturbance may be an important issue related to operational reliability of the memory device 200. After occurrence of the snapback, unstable current and voltage may be applied to the phase changeable memory device, which is returned to a normal write voltage level due to a charge sharing of a line capacitor.

In example embodiments, in order to stabilize the current and the voltage of the selected memory cell, when the write enable signal WT_EN is enabled, the bit line initial voltage VL and the first word line selection voltage VNL may be applied to the selected bit line 211 and the selected word line 212, respectively, to provide the voltage difference between the selected bit line 211 and the selected word line 212 with the minimum voltage difference for turning-on the memory cell 213.

The variable resistive memory device may include the first and second write circuits 2500 and 2540 for controlling the bit line voltage and the word line voltage by increments. The initial voltage (current) may be increased to the write voltage (current) by increments to reduce the influences of the transient current when the memory cell 212 may be turned-on.

Figure 14:
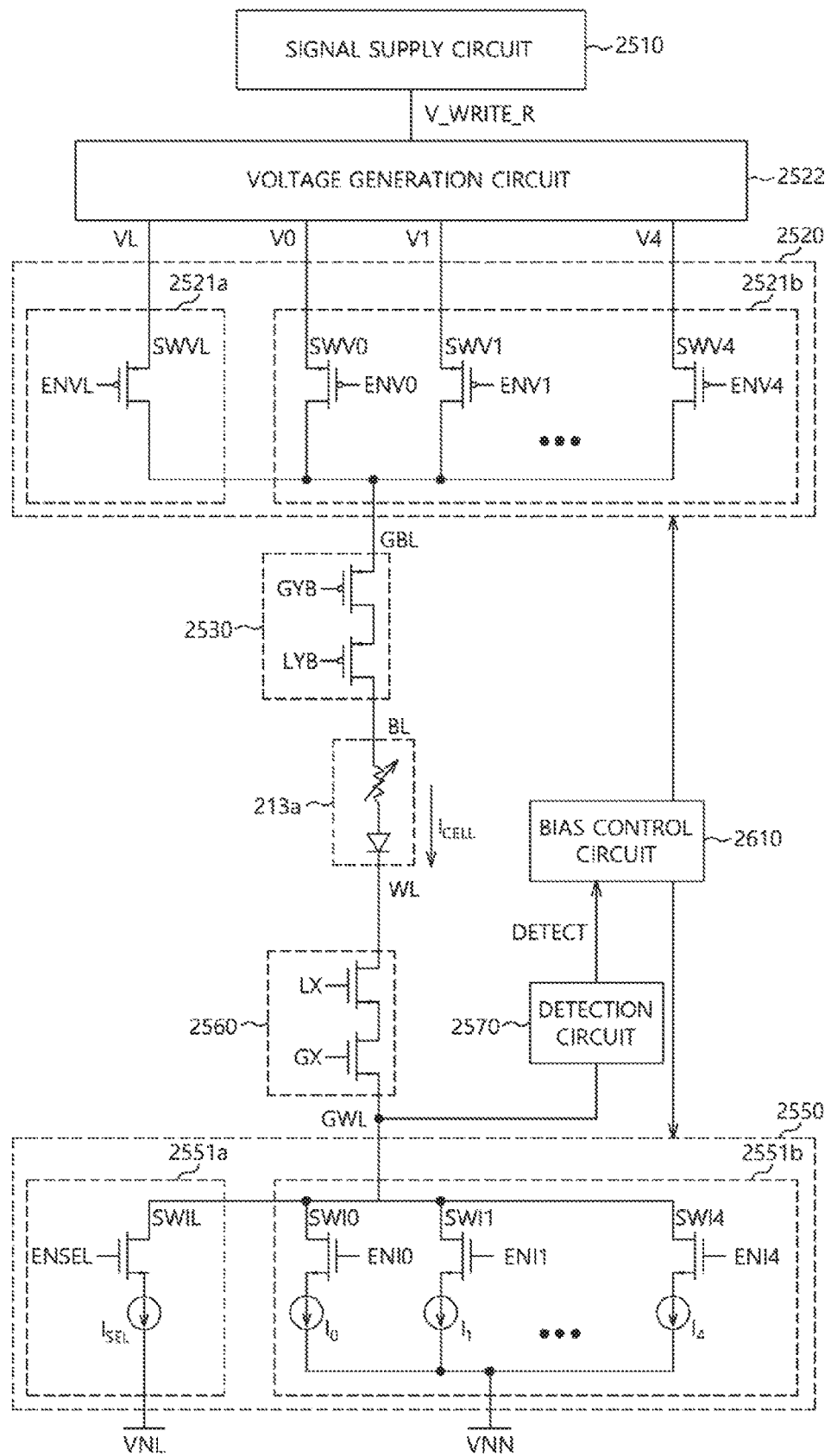
FIG. 14 shows a view illustrating a current transmission path of a variable resistive memory device, in accordance with example embodiments.
Figure 15:
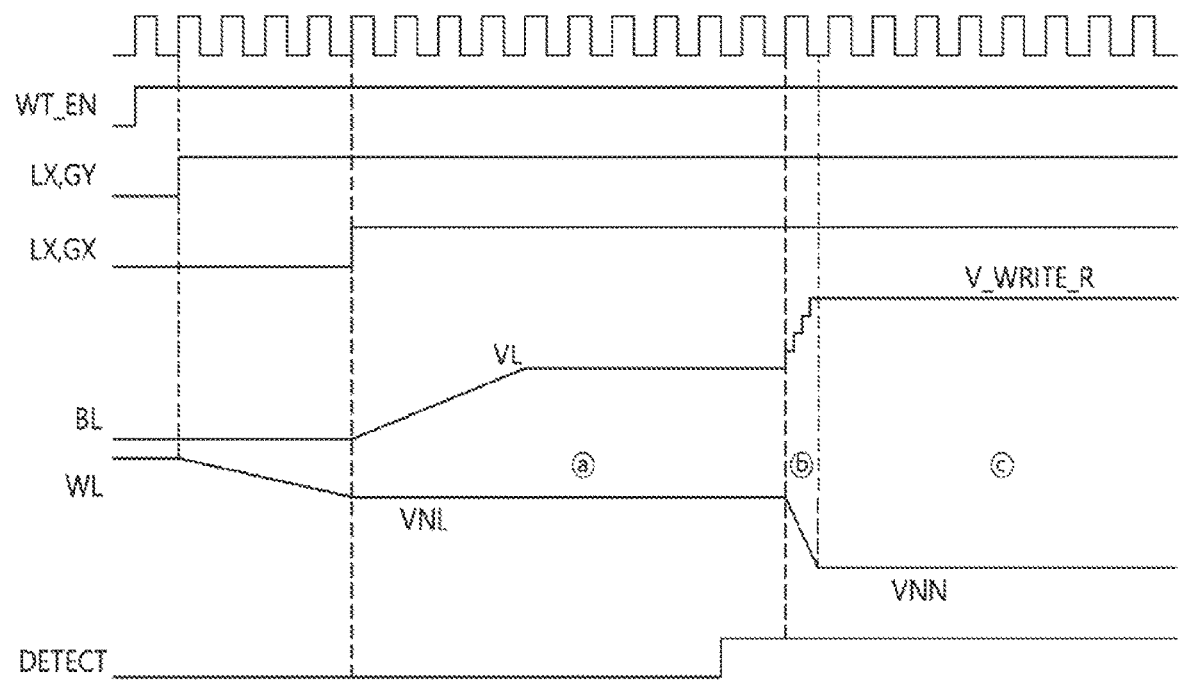
FIG. 15 shows a voltage diagram illustrating operations of a variable resistive memory device, in accordance with example embodiments.
Figure 16:
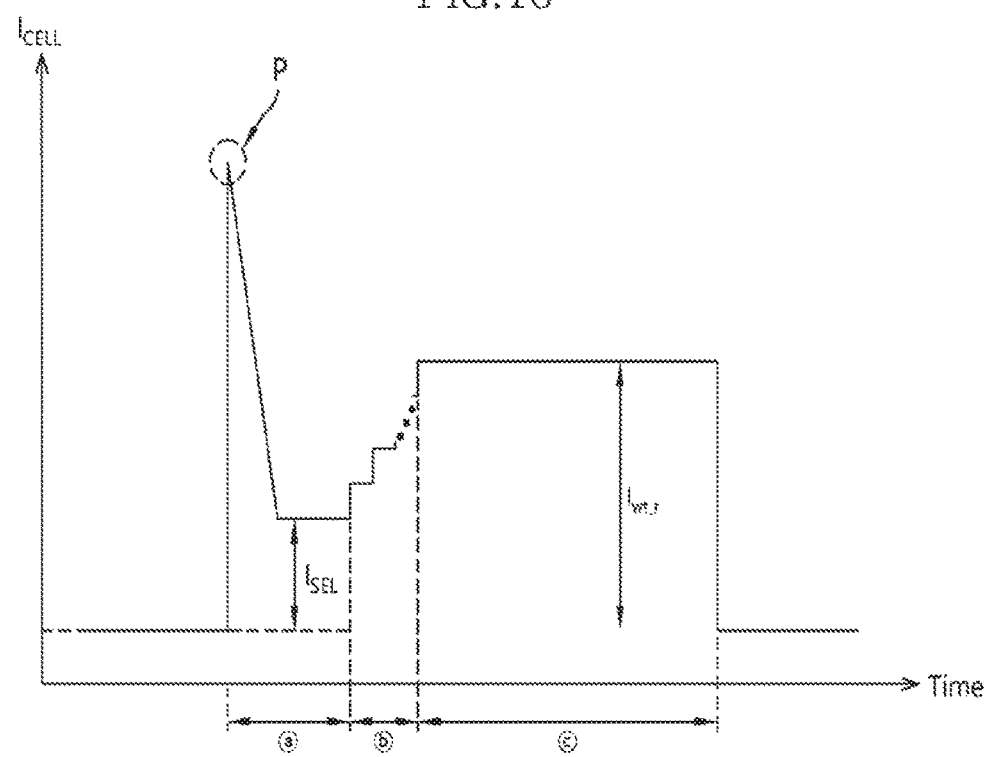
FIG. 16 shows a graph showing current changes when a variable resistive memory device is turned-on, in accordance with example embodiments.
Figure 17:
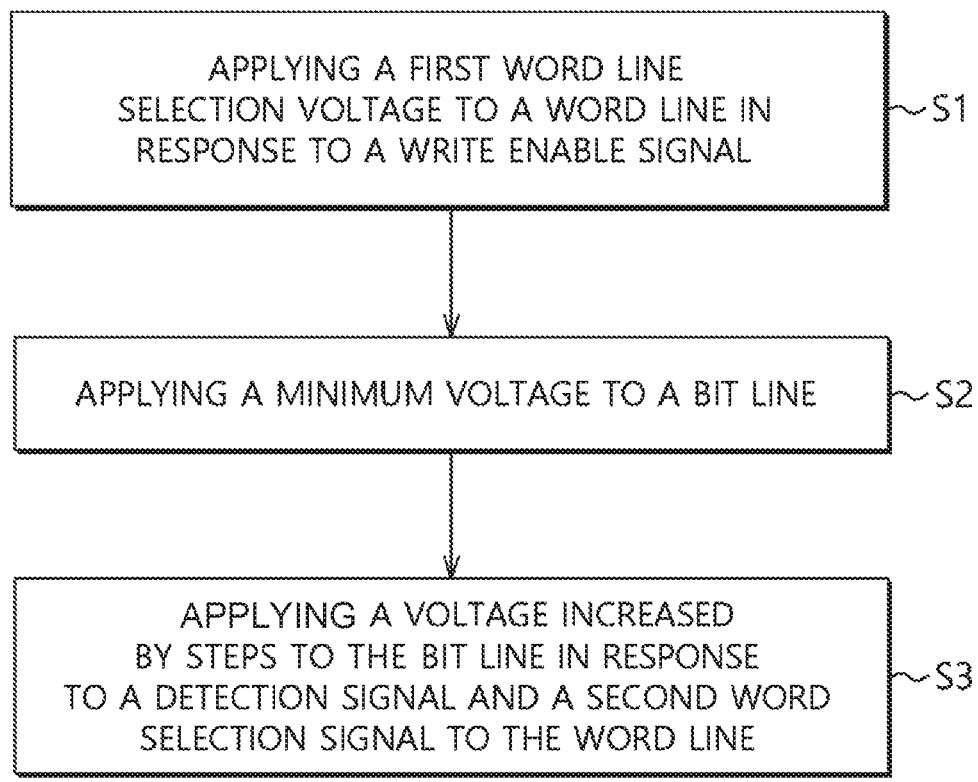
FIG. 17 shows a flow chart illustrating a method of writing a variable resistive memory device, in accordance with example embodiments.

FIG. 14 shows a view illustrating a current transmission path of a variable resistive memory device, in accordance with example embodiments. FIG. 15 shows a voltage diagram illustrating operations of a variable resistive memory device, in accordance with example embodiments. FIG. 16 shows a graph showing current changes when a variable resistive memory device is turned-on, in accordance with example embodiments, and FIG. 17 shows a flow chart illustrating a method of writing to a variable resistive memory device, in accordance with example embodiments. FIGS. 14 to 17 show reset operations causing a peak current during a writing operation of the variable resistive memory device.

Referring to FIGS. 2 and 14 to 17, a current transmission path of the variable resistive memory device 200 may be generated between the signal supply circuit 2510, the signal control circuit 2520, the first signal selection circuit 2530, the memory cell 213a, the second signal selection circuit 2560, and the current control circuit 2550.

When the write enable signal WT_EN is generated from the control circuit 260, the signal supply circuit 2510 of the first read/write circuit 2500 may output the reset voltage V_WRITE_R to the signal control circuit 2520 in response to the write enable signal WT_EN. The signal control circuit 2520 of the first read/write circuit 2500 may generate the voltages VL and V0~V4 from the reset voltage VWRITE_R. Because the detection signal DETECT may be disabled, the signal control circuit 2520 may transmit the initial voltage VL to the global bit line GBL.

When the write enable signal WT_EN is enabled before generating the detection signal DETECT, the initial current control signal ENSEL may be enabled. Thus, the initial current supply circuit 2551a may be driven to provide the word line WL with the first word line selection voltage VNL.

The control circuit 260 may enable the row selection signals LX and GX of a corresponding address in response to the write enable signal WT_EN. The global word line switch GWSW and the local word line switch LWSW of the second signal selection circuit 2560 may be turned-on by the row selection signals LX and GX of the enabled address. Therefore, the first word line selection voltage VNL may be transmitted to the word line WL of the selected address (operation S1 in FIG. 17).

When the selected word line WL is charged with the first word line selection voltage VNL, the control circuit 260 may enable the column selection signals RY and GY of the corresponding address. The previous charging of the word line 212 may prevent occurrence of an inhibit disturbance.

Because a selected bit line BL may be floated from an enabled point of the write enable signal WT_EN to an enabled point of the column selection signals LY and GY, a voltage difference between the selected word line WL and the selected bit line BL might not be generated so that the memory cell 213 might not be turned-on and the detection signal DETECT may be disabled.

When the column selection signals RY and GY are enabled, the initial voltage supply circuit 2521a may be driven. Thus, the initial voltage VL may be transmitted to the selected bit line BL (operation S2 in FIG. 17).

When the first word line selection voltage VNL is applied to the selected word line WL and the initial voltage VL is applied to the selected bit line BL, the minimum voltage difference for turning-on the memory cell 213a may be generated between the word line WL and the bit line BL of the selected memory cell 213a. Thus, a current $I_{SEL}$ corresponding to the minimum voltage difference may flow through the memory cell 213a. Further, the memory cell 213a may be turned-on in a section where the current $I_{SEL}$ corresponding to the minimum voltage difference is applied. As a result, a current amount flowing through the memory cell 213a may be increased. For various embodiments, the word "section" is used to indicate an interval of time. "In a section where," for example, can mean "during an interval when."

Generally, when the write voltage is applied to the selected bit line BL and the selected word line WL, the snapback and the overshoot current may be generated in the memory cell 213 due to the cross array structure. However, according to example embodiments, the initial voltage VL and the first word line selection voltage VNL may be inputted into the selected bit line BL and the selected word line WL in response to the write enable signal WT_EN to generate the minimum voltage difference for turning-on the memory cell 213 between the bit line BL and the word line WL. As a result, the snapback current and the overshoot current generated in example embodiments may be decreased as compared to when the write voltage may be directly applied to the selected bit line BL and the selected word line WL.

The snapback current may be an unintended and temporary current. Although the snapback current may be generated in the selected memory cell 213 due to the minimum voltage difference, the snapback current may be immediately returned to the initial current $I_{SEL}$ corresponding to the initial voltage VL and the first word line selection voltage VNL (section ⓐ in FIGS. 15 and 16).

When the memory cell 213 is turned-on, the detection circuit 2570 may detect the output current Icell of the memory cell 213 to output the detection signal DETECT enabled to a high level. When the detection signal DETECT is enabled, the bias control circuit 2610 may sequentially generate the voltage control signals ENV0~ENV4 for driving the step voltage supply circuit 2521b and the current control signals ENI0~ENI4 for driving the step current supply circuit 2551b. The step voltage supply circuit 2521b may supply the first to fifth voltages V0~V4 by steps to the selected bit line 211 (section in FIG. 15). The current Icell flowing through the memory cell 213 may be increased by steps from the first current level I0 to the fifth current level I4 corresponding to the reset current Iwt_r based on the second word line selection voltage VNN (section ⓑ in FIG. 16 and operation S3 in FIG. 17).

The fifth current control signal ENI4 and the fifth voltage control signal ENV4 may be enabled until the write enable signal WT_EN is disabled. Thus, the reset voltage V_WRITE_R for the writing operation may be applied to the selected bit line BL. The second word line section voltage VNN may be applied to the selected word line WL. As a result, the reset current Iwt_r for a programming operation may flow through the memory cell 213a (section ⓒ in FIGS. 15 and 16).

According to example embodiments, the initial voltage VL and the first word line section voltage VNL may be applied to the bit line 211 and the word line 212 at the initial point of the write operation to generate the minimum voltage difference for maintaining the turning-on of the memory cell 213. When the turning-on of the memory cell 213 is detected, the voltage (current) may be increased by steps to the reset voltage V_WRITE_R to reduce the transient current and the unstable current.

Figure 18:
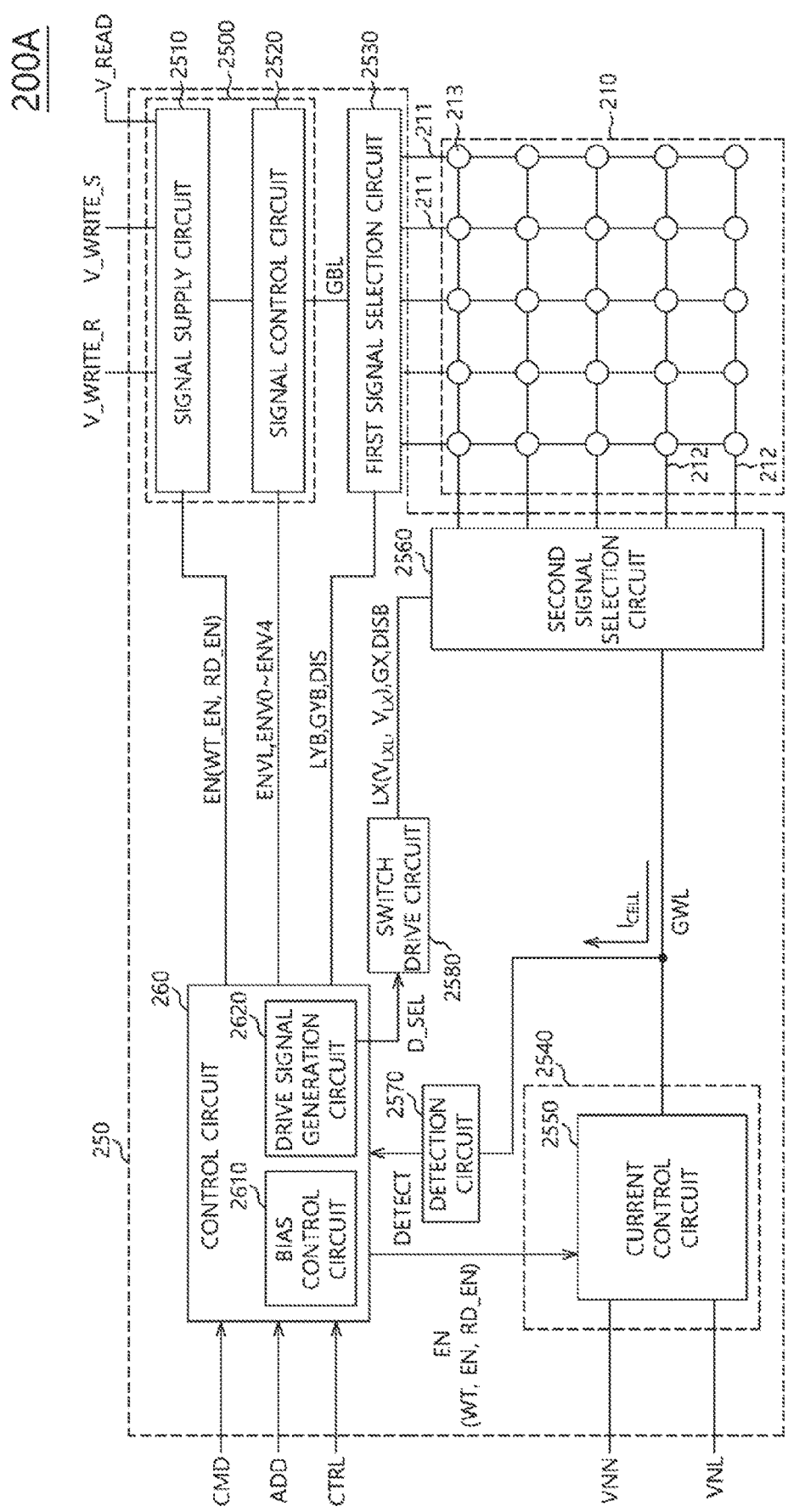
FIG. 18 shows a block diagram illustrating a variable resistive memory device, in accordance with example embodiments.

FIG. 18 shows a block diagram illustrating a variable resistive memory device 200A, in accordance with example embodiments.

The variable resistive memory device 200A of this example embodiment may include elements substantially the same as those of the variable resistive memory device 200 in FIG. 2 except for further including a switch drive circuit 2580 between the control circuit 260 and the second signal selection circuit 2560. Thus, the same reference numerals may refer to the same elements and repeated descriptions for the same elements may be omitted herein for brevity.

Figure 19:
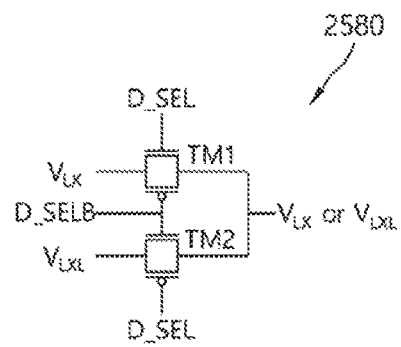
FIG. 19 shows a circuit diagram illustrating a switch drive circuit in FIG. 18.

FIG. 19 shows a circuit diagram illustrating the switch drive circuit in FIG. 18.

Referring to FIGS. 18 and 19, the switch drive circuit 2580 may change levels of the local word line selection signals LX<0>~LX<4> shown in FIGS. 2 and 8. The switch drive circuit 2580 may output a normal voltage $V_{LX}$ or a low voltage $V_{LXL}$ as the local word line selection signal LX<0>~LX<4> in accordance with a drive control signal D_SEL provided from the control circuit 260. The low voltage $V_{LXL}$ may be lower than the normal voltage $V_{LX}$. The low voltage $V_{LXL}$ may be higher than a threshold voltage of the local switches LXSW0~LXSW4 of the second selection signal circuit 2560 in FIG. 8.

The switch drive circuit 2580 may include a first transfer gate TM1 for transferring the normal voltage $V_{Lx}$ and a second transfer gate TM2 for transferring the low voltage $V_{LXL}$. The first and second transfer gates TM1 and TM2 may be selectively driven in response to the drive control signal D_SEL and an inverted drive control signal D_SELB. The drive control signal D_SEL may be generated from a drive signal generation circuit 2620 in the control circuit 260.

Figure 20:
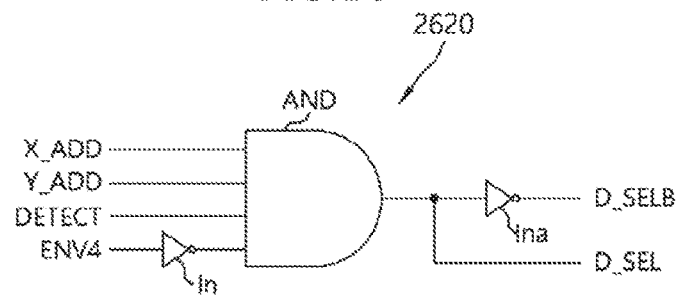
FIG. 20 shows a view illustrating a drive signal generation circuit in FIG. 18.

FIG. 20 shows a view illustrating the drive signal generation circuit 2620 in FIG. 18.

Referring to FIG. 20, the drive signal generation circuit 2620 may receive the row address X_ADD, the column address Y_ADD, the detection signal DETECT, and an inverted signal of the fifth voltage control signal ENV4 to generate the drive control signal D_SEL and the inverted drive control signal D_SELB. For example, the drive signal generation circuit 2620 may include an AND gate for applying AND logic. Because the fifth voltage control signal ENV4 may be enabled at a low level, the fifth voltage control signal ENV4 inverted by the inverter In may be inputted into the AND gate AND.

The drive signal generation circuit 2620 may determine positions of the word line WL and the bit line BL selected by the row address X_ADD and the column address Y_ADD, respectively. When the detection signal DETECT of the memory cell 213 connected with the selected word line WL and the selected bit line BL and the fifth voltage control signal ENV4 are enabled, the drive signal generation circuit 2620 may generate the enabled drive control signal D_SEL. The drive control signal D_SEL may be inverted by the inverter Ina to generate the inverted drive control signal D_SELB.

Thus, when the drive control signal D_SEL is enabled to a high level, the switch drive circuit 2580 may output the normal voltage $V_{LX}$ as the local word line selection signals LX<0>~LX<4>. When the drive control signal D_SEL is disabled, the switch drive circuit 2580 may output the low voltage $V_{LXL}$ as the local word line selection signals LX<0>~LX<4>.

Figure 21:
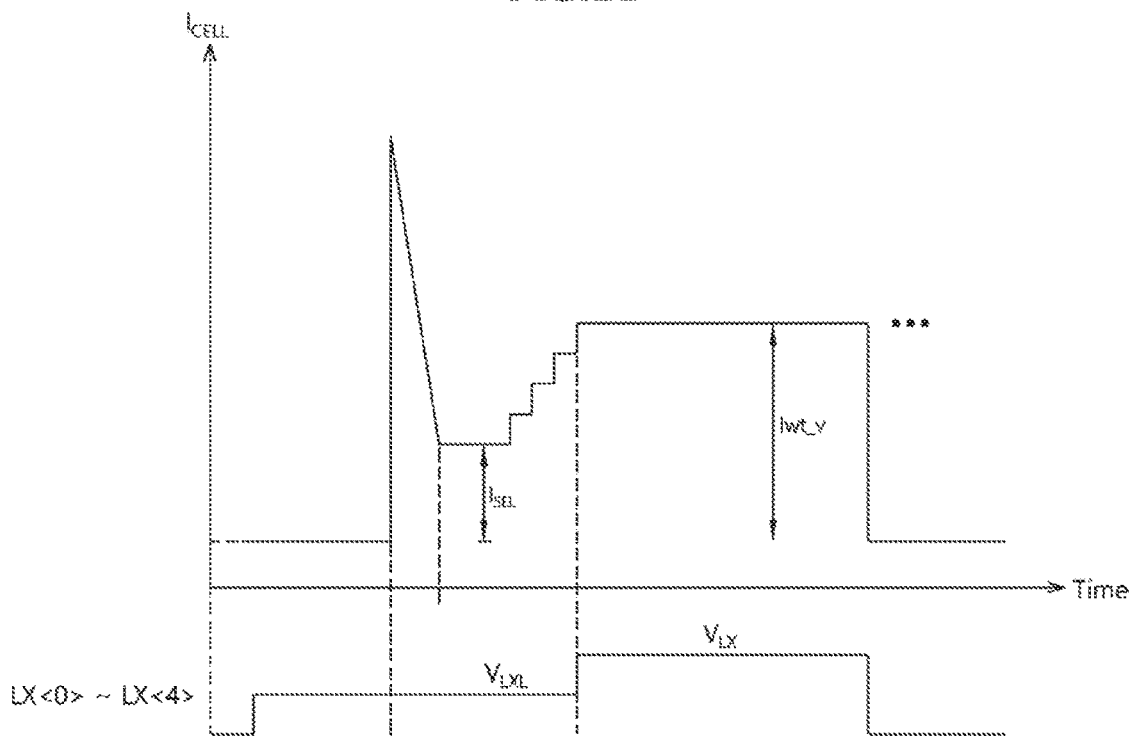
FIG. 21 shows a graph illustrating current changes when a variable resistive memory device is turned-on and voltage levels of a local word line selection signal, in accordance with example embodiments.

FIG. 21 shows a view illustrating current changes when a variable resistive memory device is turned-on and voltage levels of a local word line selection signal, in accordance with example embodiments.

Referring to FIG. 21, when the drive control signal D_SEL is disabled, the low voltage $V_{LXL}$ may be provided as the local word line selection signals LX<0>~LX<4>. When the fifth voltage control signal ENV4 for switching the reset voltage V_WRITE_R with the bit line 211 is enabled to a low level, the drive control signal D_SEL may be enabled. Thus, the switch drive circuit 2580 may provide the normal voltage $V_{LX}$ as the local word line selection signals LX<0>~LX<4>.

When the voltage is applied to the bit line 211 in steps, that is, the current Icell applied to the memory cell 213 is increased in steps, the low voltage $V_{LXL}$ may be applied to the local word line switches LXSW<0>~LXSW<4> of the second signal selection circuit 2560. Thus, driving forces of the local word line switches LXSW<0>~LXSW<4> may be decreased. As a result, the driving forces of the local word line switches LXSW<0>~LXSW<4> may be decreased in a section where the transient current or the snapback current may be generated to further reduce the influences of the transient current.

A drift may be generated in the memory cell 213 to change a critical voltage due to continuous operations or influences of an adjacent cell. Although the initial voltage VL and the first word line selection voltage VNL may be applied to the bit line 211 and the word line 212 of the memory cell 213, respectively, the memory cell 213 might not be turned-on due to the drift.

In order to solve the drift issue, the initial voltage VL of the bit line 211 may have multiple levels.

Figure 22:
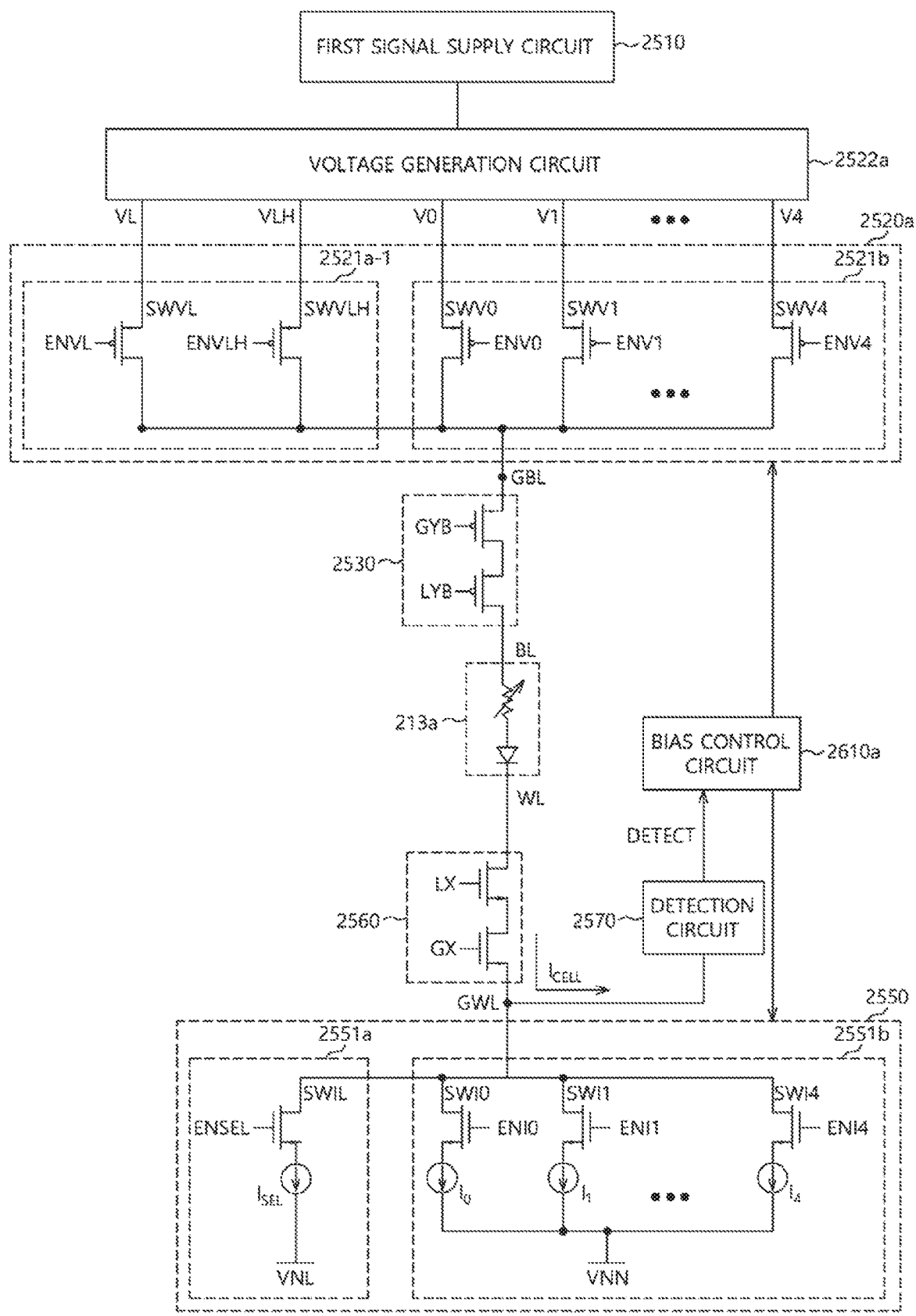
FIG. 22 shows a view illustrating a current transmission path of a variable resistive memory device including an initial voltage supply circuit, in accordance with example embodiments.

FIG. 22 shows a view illustrating a current transmission path of a variable resistive memory device including an initial voltage supply circuit, in accordance with example embodiments.

Referring to FIG. 22, a signal control circuit 2520A may include an initial voltage supply circuit 2521a-1 for selectively outputting the initial voltage VL and an additional initial voltage VLH.

The initial voltage supply circuit 2521a-1 may include an initial switch SWLV for transferring the initial voltage VL in response to an initial voltage control signal ENVL, and an additional switch SWVLH for transferring an additional initial voltage VLH=VL+α in response to an additional voltage control signal ENVLH.

The additional switch SWVLH may include a PMOS transistor similarly to the initial switch SWVL. When the initial voltage control signal ENVL is enabled, the additional voltage control signal ENVLH may also be enabled. The additional voltage control signal ENVLH may be generated in the bias control circuit 2610a of the control circuit 260.

Figure 23:
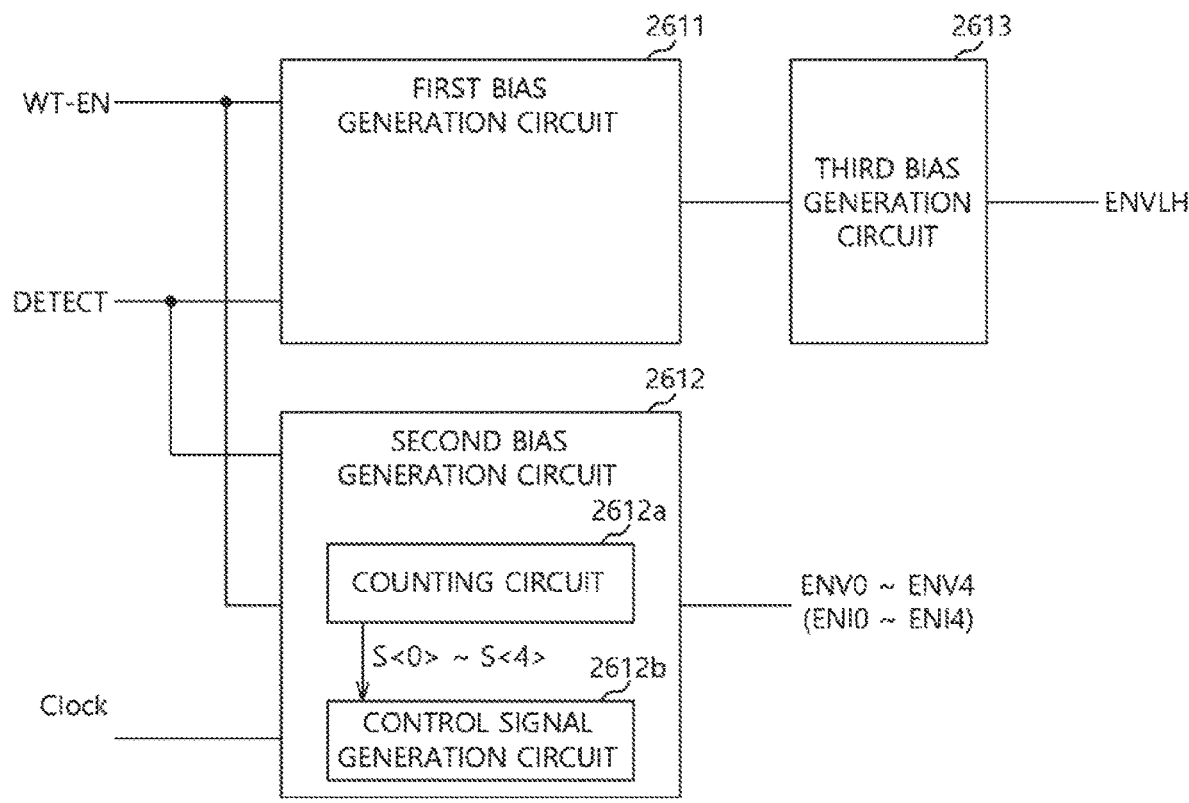
FIG. 23 shows a block diagram illustrating a bias control circuit, in accordance with example embodiments.

FIG. 23 shows a block diagram illustrating a bias control circuit in accordance with example embodiments.

A bias control circuit 2610a of this example embodiment may include elements substantially the same as those of the bias control circuit 2610 in FIG. 10 except for further including a third bias control circuit 2613 for generating the additional voltage control signal ENVLH. Thus, the same reference numerals may refer to the same elements and repeated descriptions of the same elements are omitted herein for brevity.

Referring to FIG. 23, when the initial voltage control signal ENVL is enabled for a predetermined time, the third bias generation circuit 2613 may be enabled in accordance with the predetermined time.

For example, the third bias generation circuit 2613 may include a timer circuit. When the initial voltage control signal ENVL is enabled for a time set in the timer circuit, the third bias generation circuit 2613 may disable the initial voltage control signal ENVL after lapsing the set time of the timer circuit. Further, the third bias generation circuit 2613 may enable the additional voltage control signal ENVLH.

Figure 24:
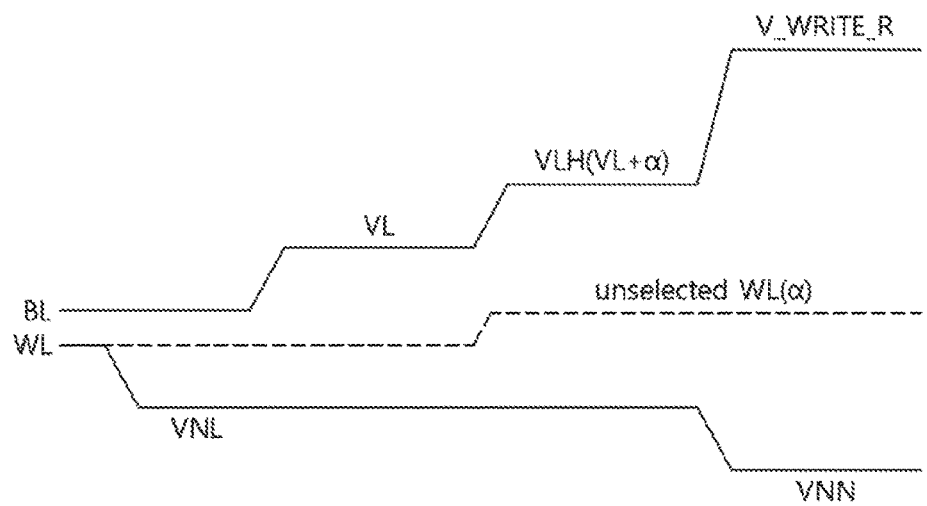
FIG. 24 shows a voltage diagram illustrating operations of a variable resistive memory device, in accordance with example embodiments.

FIG. 24 shows a voltage diagram illustrating operations of a variable resistive memory device, in accordance with example embodiments.

Referring to FIG. 24, when the memory cell does not turn on after applying the initial voltage VL and the first word line selection voltage VNL to the selected bit line BL and the selected word line WL, respectively, the signal control circuit 2520A may supply the additional initial voltage VLH greater than the initial voltage VL and less than the first voltage V0 to the bit line 211. Thus, because the voltage difference between the selected bit line BL and the selected word line WL may be increased by a voltage α, the turn-on timing of the memory cell 213 may be advanced.

In order to prevent the turning on of an unselected word line due to applying the additional initial voltage VLH, a voltage of the unselected word line may be increased by the voltage α, i.e., a difference between the additional initial voltage VLH and the initial voltage VL.

Figure 25:
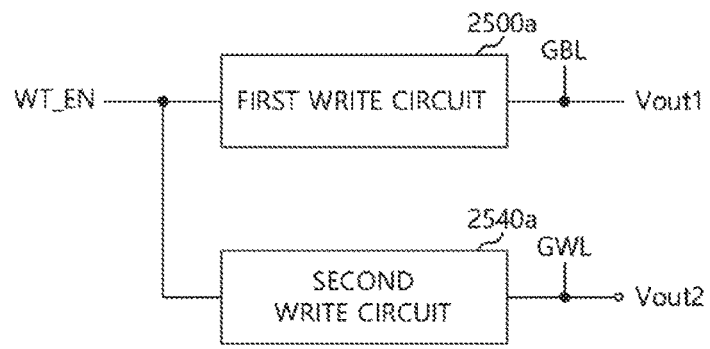
FIG. 25 shows a block diagram illustrating a first read/write circuit and a second read/write circuit, in accordance with example embodiments.

FIG. 25 shows a block diagram illustrating a first read/write circuit and a second read/write circuit, in accordance with example embodiments.

Referring to FIG. 25, the first read/write circuit 2500a may provide the global bit line GBL with a first pulse voltage Vout1 in response to the write enable signal WT_EN. The second read/write circuit 2450a may provide the global word line GWL with a second pulse voltage Vout2 in response to the write enable signal WT_EN.

The write enable signal WT_EN may include a reset enable signal and a set enable signal. This example embodiment may include the reset enable signal having a relatively high operational voltage as compared to the set enable signal.

The first read/write circuit 2500a may generate the first pulse voltage Vout1 increased by steps during an initial operation section. The initial operation section may be from a generation point of the write enable signal WT_EN to the target reset voltage V_WRITE_R. Thus, the first pulse voltage Vout1 may be developed by steps from the initial voltage VL or about 0V to the target reset voltage V_WRITE_R.

The second read/write circuit 2450a may generate the second pulse voltage Vout2 having a waveform different from that of the first pulse voltage Vout1. For example, the second read/write circuit 2450a may generate the second pulse voltage Vout2 linearly controlled during the initial operation section. Further, the second read/write circuit 2450a may generate the second pulse voltage Vout2 decreased by steps corresponding to the first pulse voltage Vout1 during the initial operation section.

Figure 26:
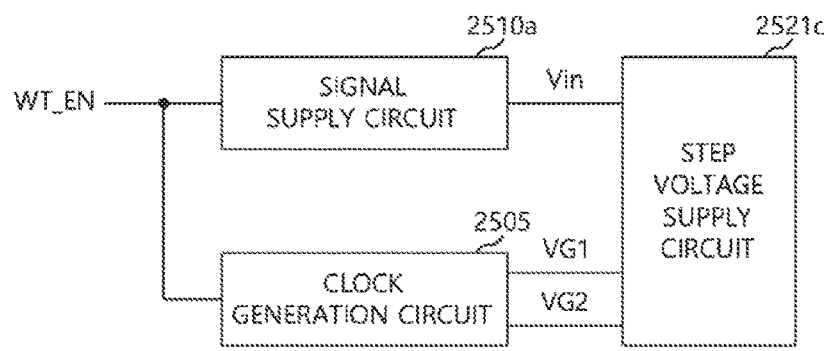
FIG. 26 shows a block diagram illustrating a first read/write circuit, in accordance with example embodiments.

FIG. 26 shows a block diagram illustrating the first read/write circuit of FIG. 25, in accordance with example embodiments.

Referring to FIG. 26, the first read/write circuit 2500a for generating the increased stepped pulse may include a clock generation circuit 2505, a signal supply circuit 2510a, and a step voltage supply circuit 2521c.

The clock generation circuit 2505 may generate a first clock signal VG1 and a second clock signal VG2 in response to the write enable signal WT_EN. The first clock signal VG1 and the second clock signal VG2 may have a phase difference of about 180°. The first clock signal VG1 and the second clock signal VG2 may be toggled several times during the initial operation section. The toggling times may determine numbers of the stepped pulse.

The signal supply circuit 2510a may generate the write voltages V_WRITE_R and V_WRITE_S corresponding to an input voltage yin in response to the write enable signal WT_EN. The write voltages V_WRITE_R and V_WRITE_S outputted from the signal supply circuit 2510a may include a section linearly increased from the initial voltage VL or about 0V to the target write voltage. In example embodiments, the initial operation section may correspond to the section linearly increased from the initial voltage VL or about 0V to the target write voltage. The write voltage of this example embodiment may be the reset voltage V_WRITE_R causing a high peak current.

The step voltage supply circuit 2521c may generate the first pulse voltage Vout1 increased by steps based on the first and second clock signals VG1 and VG2 and the reset voltage V_WRITE_R.

Figure 27:
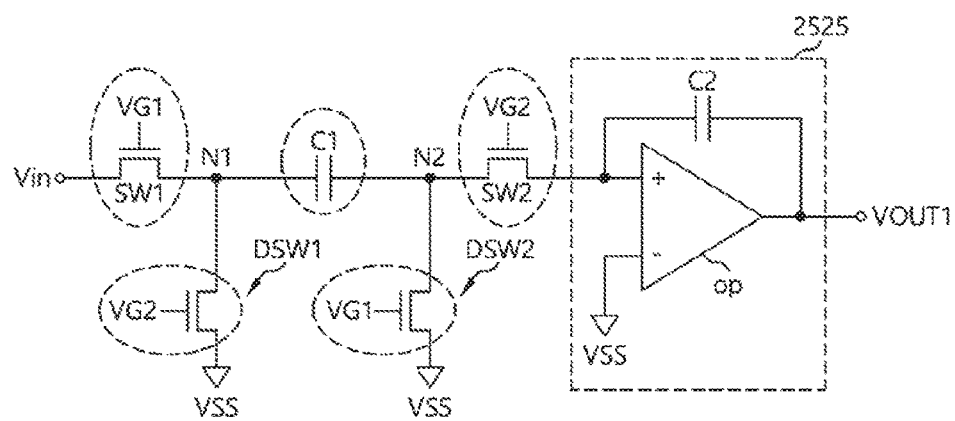
FIG. 27 shows a circuit diagram illustrating a step voltage supply circuit, in accordance with example embodiments.
Figure 28:
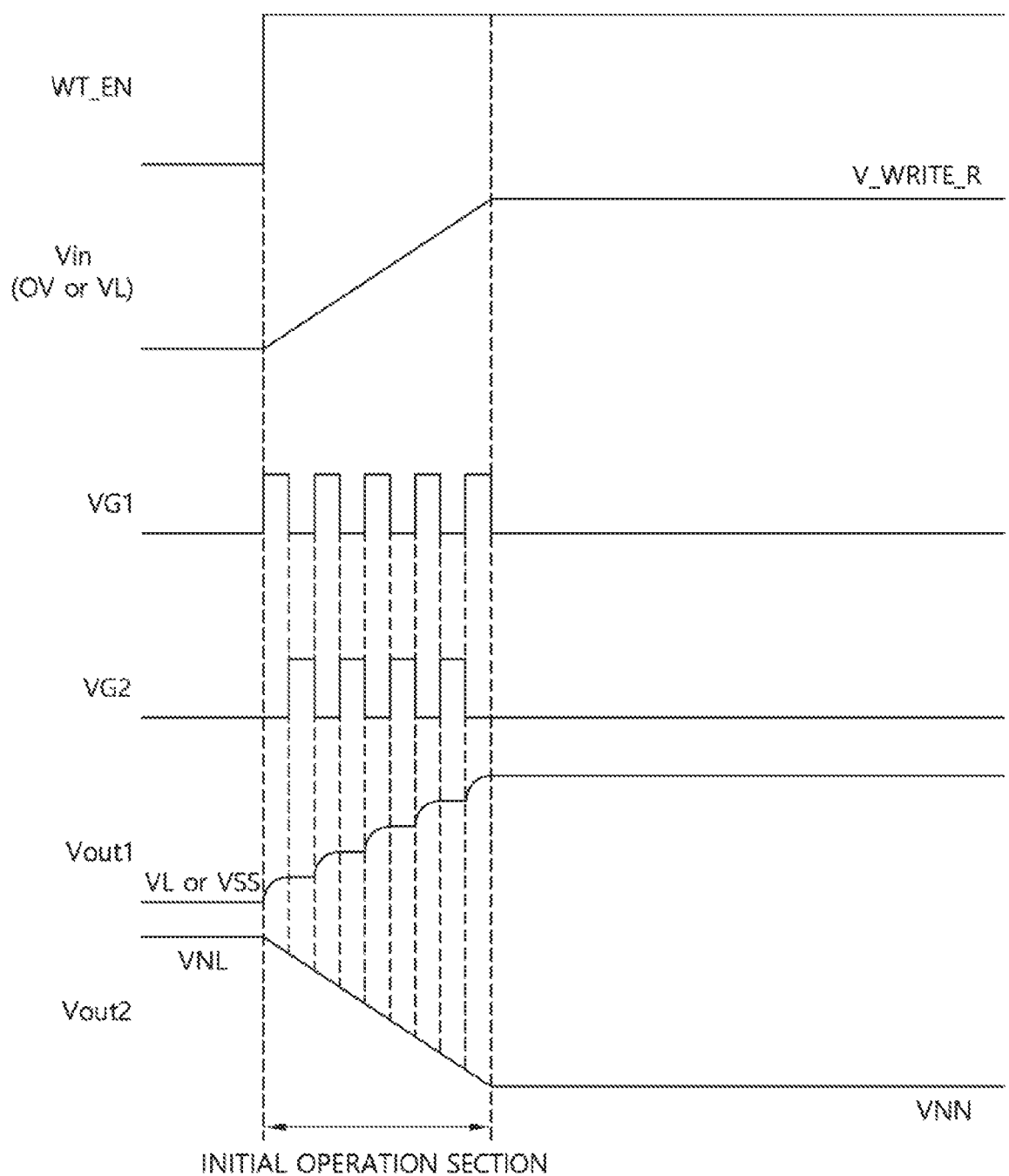
FIG. 28 shows a voltage diagram illustrating operations of the step voltage supply circuit in FIG. 27.

FIG. 27 shows a circuit diagram illustrating the step voltage supply circuit 2521c of FIG. 26, in accordance with example embodiments, and FIG. 28 shows a voltage diagram illustrating operations of the step voltage supply circuit 2521c shown in FIGS. 26 and 27.

Referring to FIG. 27, the step voltage supply circuit 2521c may include a first switch SW1, a first discharge switch DSW1, a storage C1, a second switch SW2, a second discharge switch DSW2, and an integrator 2525.

The first switch SW1 may transmit the input voltage yin, for example, the reset voltage V_WRITE_R, to a first node N1 in response to the first clock signal VG1. The first switch SW1 may include an NMOS transistor. The reset voltage V_WRITE_R may be initiated from about 0V or the initial voltage VL.

The first discharge switch DSW1 may be connected between the first node N1 and a ground voltage terminal Vss to discharge the voltage in the first node N1 in response to the second clock signal VG2. The first discharge switch DSW1 may include an NMOS transistor.

The storage C1 may be connected between the first node N1 and a second node N2 to temporarily store the voltage of the first node N1 and transmit a voltage in the storage C1 to the second node N2. The storage C1 may include a capacitor.

The second discharge switch DSW2 may be connected between the second node N2 and the ground voltage terminal Vss to discharge a voltage in the second node N2 in response to the first dock signal VG1. The second discharge switch DSW2 may include an NMOS transistor.

The integrator 2525 may integrate and output an output voltage of the second switch SW2. The integrator 2525 may include an amplifier OP and a capacitor C2. A first input terminal (+) of the amplifier OP may be connected with an output terminal of the second switch SW2. A second input terminal (−) of the amplifier OP may be connected with the ground voltage terminal Vss. The capacitor C2 may be connected between the first input terminal (+) and an output terminal of the amplifier OP to control a voltage charged in the capacitor C2. When a voltage difference may be generated between the first input terminal (+) and the output terminal of the amplifier OP, the capacitor C2 may be charged with the voltage difference to reflect the voltage charged in the capacitor C2 on the first pulse voltage Vout1. In contrast, when the voltage difference is not generated between the first input terminal (+) and the output terminal of the amplifier OP, the integrator 2524 may output the voltage of the first input terminal (+).

Referring to FIG. 28, when the write enable signal WT_EN is enabled, the first signal supply circuit 2510a may provide the input voltage yin, for example, the reset voltage V_WRITE_R, as the input voltage of the step voltage supply circuit 2521c. The input voltage Vin may linearly increase in the initial operation section from about 0V or the initial voltage VL to the target rest voltage V_WRITE_R.

The clock generation circuit 2505 may generate the first and second clock signals VG1 and VG2 toggled several times during the initial operation section.

The step voltage supply circuit 2521c may be operated as follows. When the first clock signal VG1 is enabled to a high level, the first switch SW1 and the second discharge switch DSW2 may be turned-on to transmit the input voltage yin to the first node N1 and to charge the storage C1 with the input voltage Vin. When the second clock signal VG2 is enabled, the first discharge switch DSW1 and the second switch SW2 may be turned-on so that charge at the first node N1 may be discharged and the input voltage Vin in the storage C1 may be transmitted to the integrator 2525 through the second switch SW2. The capacitor C2 of the integrator 2525 may accumulate differences between the input voltage and the output voltage of the amplifier OP to output the voltage difference as the first pulse voltage Vout1. Thus, the first pulse voltage Vout1 is generated and increased by steps during a section where the input voltage yin is increased.

The second pulse voltage Vout2 may be linearly developed from the first word line selection voltage VNL to the second word line selection voltage VNN, as indicated with reference to FIG. 15.

The second read/write circuit 2540a may further include a step word line voltage generation circuit 2551c for applying a voltage decreased by steps to the word line.

Figure 29:
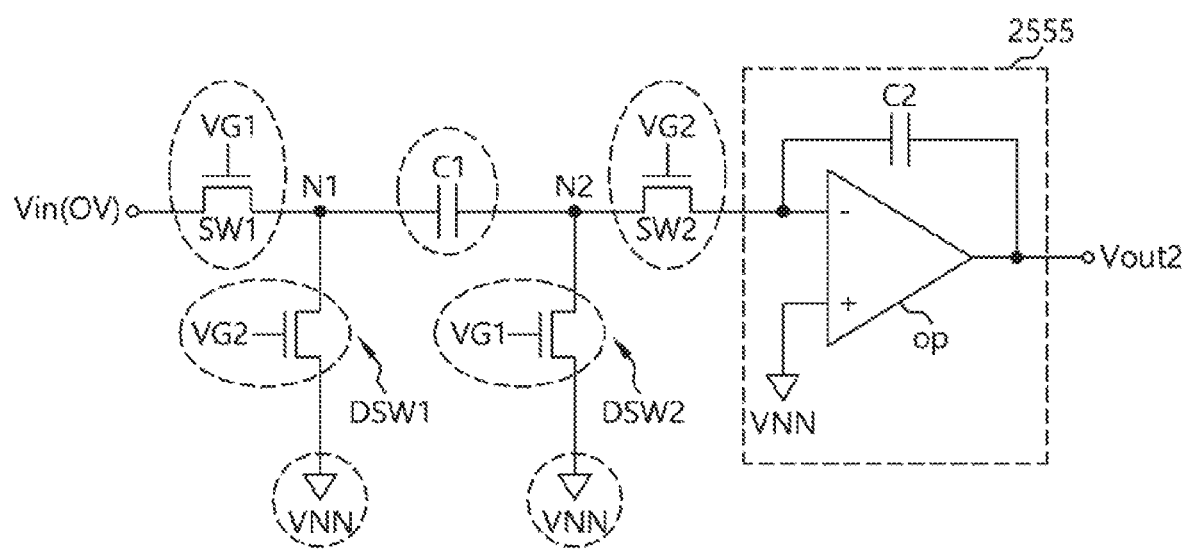
FIG. 29 shows a circuit diagram illustrating a step word line voltage generation circuit, in accordance with example embodiments.
Figure 30:
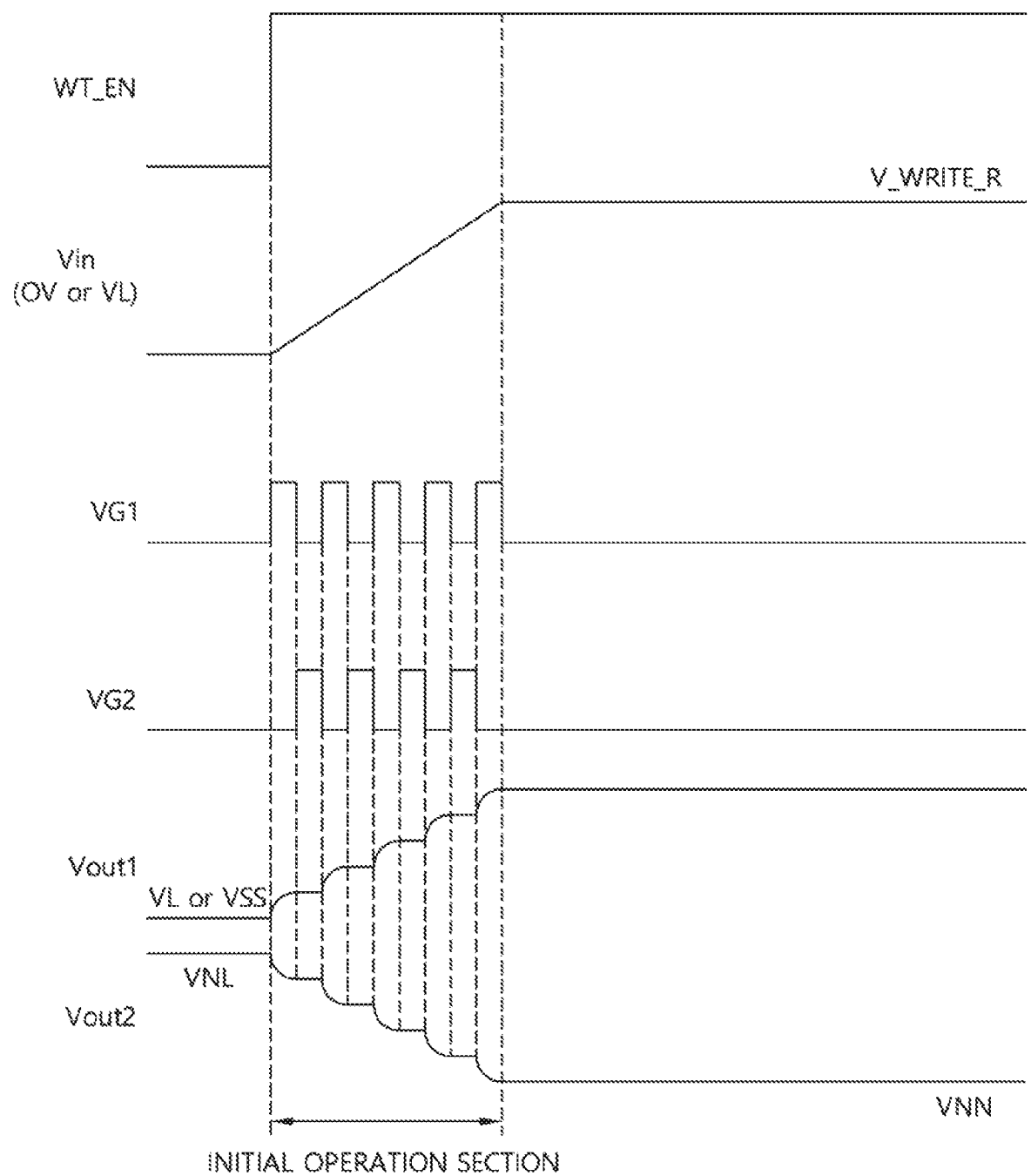
FIG. 30 shows a voltage diagram illustrating operations of the step word line voltage generation circuit in FIG. 29.

FIG. 29 shows a circuit diagram illustrating the step word line voltage generation circuit 2551c, in accordance with example embodiments, and FIG. 30 shows a voltage diagram illustrating operations of the step word line voltage generation circuit 2551c in FIG. 29.

Referring to FIG. 29, the step word line voltage generation circuit 2551c may have configurations substantially the same as those of the step voltage supply circuit 2511c in FIG. 27. In contrast, the ground voltage Vss or the initial voltage VL as the input voltage Vin may be inputted into the step word line voltage generation circuit 2551c. Discharge switches DSW1 and DSW2 may be connected between the ground voltage terminal Vss and a terminal of the second word line selection voltage VNN having a negative level. By performing operations substantially the same as those illustrated with reference to FIG. 27, as shown in FIG. 30, about 0V to the second word line selection voltage VNN may be supplied to the global word line GWL.

According to example embodiments, the reset voltage applied to a bit line and/or a word line may be increased by steps to a target level in response to a detection signal or a write enable signal generated when a memory cell is turned on. Thus, the unintended generations of the snapback current and the overshoot current may be reduced.

The limited number of possible embodiments described above are intended to illustrate and not to limit the present teachings. Various alternative and/or equivalent embodiments are possible. The invention is not limited by the embodiments described herein. Nor is the invention limited to any specific type of semiconductor device. Other additions, subtractions, and/or modifications are evident in view of the present disclosure and are intended to fall within the scope of the appended claims.

What is claimed is:

1. A variable resistive memory device comprising:
a memory cell connected between a word line and a bit line;
a first circuit for providing the bit line with a first pulse voltage based on at least one enable signal;
a second circuit for providing the word line with a second pulse voltage based on the at least one enable signal; and
a detection circuit configured to output a detection signal based on a voltage difference between the word line and the bit line when the memory cell is turned on,
wherein the first circuit generates the first pulse voltage to increase in steps from an initial voltage level to a target voltage level.

2. The variable resistive memory device of claim 1, wherein the first circuit comprises a signal control circuit connected with the bit line to provide the bit line with a voltage increased in steps from an initial voltage to a target level of the first pulse voltage based on any one of the enable signal and the detection signal.

3. The variable resistive memory device of claim 2, wherein the signal control circuit comprises an initial voltage supply circuit for providing the bit line with the initial voltage in response to the enable signal.

4. The variable resistive memory device of claim 3, wherein the signal control circuit further comprises a step voltage supply circuit for providing the bit line with a voltage increased in steps from a first voltage higher than the initial voltage to the target level of the first pulse voltage in response to the enable signal and the detection signal.

5. The variable resistive memory device of claim 1, wherein the second circuit selectively provides the word line with a first word line selection voltage and a second word line selection voltage as the second pulse voltage.

6. The variable resistive memory device of claim 5, wherein a difference between the initial voltage and the first word line selection voltage corresponds to a minimum voltage difference for turning on the memory cell.

7. The variable resistive memory device of claim 5, wherein the second circuit comprises a current control circuit connected to the word line, and wherein the current control circuit increases a current in steps from an initial current to a target level of a write current.

8. The variable resistive memory device of claim 7, wherein the current control circuit comprises an initial current supply circuit for providing the word line with the initial current in response to the enable signal.

9. The variable resistive memory device of claim 8, wherein the current control circuit further comprises a step current supply circuit for providing the word line with a current increased in steps from a first current higher than the initial current to the target level of the write current based on the enable signal and the detection signal.

10. The variable resistive memory device of claim 1, wherein the first pulse voltage has a waveform increased in steps from a ground voltage to the target voltage level of the first pulse voltage.

11. The variable resistive memory device of claim 10, wherein the second pulse voltage has a waveform decreased in steps from the ground voltage to the target voltage level of the second pulse voltage.

12. The variable resistive memory device of claim 1, wherein the first circuit comprises:

a clock generation circuit for generating a first clock signal and a second clock signal based on the enable signal;
a signal supply circuit for generating an input voltage applied to the bit line based on the enable signal; and
a step voltage supply circuit for generating the first pulse voltage based on the first and second clock signals and the input voltage,
wherein the input voltage linearly increases to a target level of the input voltage.

13. The variable resistive memory device of claim 12, wherein the clock generation circuit generates the first and second clock signals during an initial operation section corresponding to a section where the input voltage is increased to the target level, and wherein the first and second clock signals have a phase difference of about 180°.

14. The variable resistive memory device of claim 13, wherein the step voltage supply circuit comprises:
a first switch for transferring the input voltage to a first node based on the first clock signal;
a storage connected between the first node and a second node;
a second switch for transferring a voltage of the second node based on the second clock signal;
an integrator connected between the second switch and an output terminal;
a first discharge switch for discharging a voltage of the first node in response to the second clock signal; and
a second discharge switch for discharging the voltage of the second node in response to the first clock signal.

15. The variable resistive memory device of claim 14, wherein the first discharge switch is connected between the first node and a ground voltage terminal, and the second discharge switch is connected between the second node and the ground voltage terminal.

16. The variable resistive memory device of claim 13, wherein the second circuit comprises a second step voltage supply circuit for generating the second pulse voltage based on the first and second clock signals and a word line selection voltage inputted into the word line, and wherein the word line selection voltage linearly increases to a target level of the word line selection voltage.

17. The variable resistive memory device of claim 16, wherein the second step voltage supply circuit comprises:
a first switch for transferring a ground voltage to a first node based on the first clock signal;
a storage connected between the first node and a second node;
a second switch for transferring a voltage of the first node based on the second clock signal;
an integrator connected between the second switch and an output terminal;
a first discharge switch for discharging the voltage of the first node in response to the second clock signal; and
a second discharge switch for discharging a voltage of the second node in response to the first clock signal.

18. The variable resistive memory device of claim 17, wherein the first discharge switch is connected between the first node and a word line selection voltage terminal having a negative level, and the second discharge switch is connected between the second node and the word line selection voltage terminal.

* * * * *